(12) United States Patent
Tachibana et al.

(10) Patent No.: US 7,598,015 B2
(45) Date of Patent: Oct. 6, 2009

(54) POLYMER, RESIST COMPOSITION AND PATTERNING PROCESS

(75) Inventors: Seiichiro Tachibana, Joetsu (JP); Takeru Watanabe, Joetsu (JP); Tsunehiro Nishi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 302 days.

(21) Appl. No.: 11/155,605

(22) Filed: Jun. 20, 2005

(65) Prior Publication Data

US 2005/0282082 A1 Dec. 22, 2005

(30) Foreign Application Priority Data

Jun. 21, 2004 (JP) ............................. 2004-182741

(51) Int. Cl.
G03F 7/039 (2006.01)
G03F 7/20 (2006.01)
G03F 7/30 (2006.01)
G03F 7/38 (2006.01)
G03C 1/73 (2006.01)

(52) U.S. Cl. ..................... 430/270.1; 430/326; 430/330; 430/910; 526/268; 526/266; 526/270; 526/282

(58) Field of Classification Search ........................ None
See application file for complete search history.

(56) References Cited

U.S. PATENT DOCUMENTS

| | | | |
|---|---|---|---|
| 6,004,724 A | 12/1999 | Yamato et al. | |
| 6,261,738 B1 | 7/2001 | Asakura et al. | |
| 6,280,898 B1 | 8/2001 | Hasegawa et al. | |
| 6,312,867 B1 | 11/2001 | Kinsho et al. | |
| 6,517,994 B2 | 2/2003 | Watanabe | |
| 6,586,157 B2 | 7/2003 | Hasegawa et al. | |
| 6,596,463 B2 | 7/2003 | Hasegawa et al. | |
| 6,746,818 B2 | 6/2004 | Kinsho et al. | |
| 7,179,578 B2 | 2/2007 | Sato et al. | |
| 2002/0150835 A1* | 10/2002 | Nishi et al. | 430/270.1 |
| 2003/0198891 A1 | 10/2003 | Hasegawa et al. | |
| 2004/0068124 A1 | 4/2004 | Hasegawa et al. | |

FOREIGN PATENT DOCUMENTS

| | | |
|---|---|---|
| EP | 1 004 568 A2 * | 5/2000 |
| JP | 4-39665 A | 2/1992 |
| JP | 9-95479 A | 4/1997 |
| JP | 9-208554 A | 8/1997 |
| JP | 9-230588 A | 9/1997 |
| JP | 9-301948 A | 11/1997 |
| JP | 2906999 B2 | 4/1999 |
| JP | 2000-159758 A | 6/2000 |
| JP | 2000-314956 A | 11/2000 |
| JP | 2000-336121 A | 12/2000 |
| JP | 2002-3537 A | 1/2002 |
| JP | 2002-303978 A | 10/2002 |
| JP | 2002-371114 A | 12/2002 |
| JP | 2003-2883 A | 1/2003 |
| JP | 2003-5374 * | 1/2003 |
| JP | 2004-115486 A | 4/2004 |
| JP | 2004-143153 A | 5/2004 |

OTHER PUBLICATIONS

Machine-assisted English translation of JP 2003-5374 provided by JPO.*
Arimitsu et al., "Sensitivity Enhancement of Chemical-Amplification-Type Photoimaging Materials by Acetoacetic Acid Derivatives", Journal of Photopolymer Science and Technology, vol. 8, No. 1 (1995), pp. 43-44.
Arimitsu et al., "Effect of Phenolic Hydroxyl Residues on the Improvement of Acid-Proliferation-Type Photoimaging Materials", Journal of Photopolymer Science and Technology, vol. 9, No. 1 (1996), pp. 29-30.

* cited by examiner

*Primary Examiner*—Sin J. Lee
(74) *Attorney, Agent, or Firm*—Birch, Stewart, Kolasch & Birch, LLP

(57) ABSTRACT

A (meth)acrylic copolymer is endowed with a good profile of rigidity and hydrophilicity by introducing not only polycyclic structure units, but also recurring units having a high polarity. A chemically amplified positive resist composition comprising the polymer has a high sensitivity, resolution and etch resistance and improved substrate adhesion and developer affinity.

19 Claims, No Drawings

POLYMER, RESIST COMPOSITION AND PATTERNING PROCESS

CROSS-REFERENCE TO RELATED APPLICATION

This non-provisional application claims priority under 35 U.S.C. §119(a) on Patent Application No. 2004-182741 filed in Japan on Jun. 21, 2004, the entire contents of which are hereby incorporated by reference.

TECHNICAL FIELD

This invention relates to (i) a novel polymer for resist use, (ii) a resist composition comprising the polymer as a base resin for use in the micropatterning technology, and (iii) a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using a KrF or ArF excimer laser as the light source is strongly desired to reach the practical level as the micropatterning technique capable of achieving a feature size of 0.3 μm or less.

The chemically amplified resist materials for use in photolithography using light of an excimer laser, especially ArF excimer laser having a wavelength of 193 nm, are, of course, required to have a high transparency to light of that wavelength. In addition, they are required to have an etching resistance sufficient to allow for film thickness reduction, a high sensitivity sufficient to eliminate any extra burden on the expensive optical material, and especially, a high resolution sufficient to form a precise micropattern. To meet these requirements, it is crucial to develop a base resin having a high transparency, dry etch resistance and reactivity. Active efforts have been made to develop such base resins.

Known high transparency resins include copolymers of acrylic or methacrylic acid derivatives (see JP-A 4-39665). These resins, however, are very low in dry etching resistance and not considered practical as the resist composition base resin. Their drawback can be overcome by introducing a certain amount of units containing a polycyclic structure as typified by adamantane structure. However, the resulting polymer becomes highly hydrophobic as a whole, often inviting pattern stripping due to reduced substrate adhesion and development defects due to developer liquid cissing. That is, the introduction of a large amount of polycyclic structure, which is intended to enhance etch resistance, is impractical because of the occurrence of pattern stripping and development defects. On the other hand, the introduction of a small amount of polycyclic structure results in practically unacceptable etch resistance. While a finer pattern rule is being demanded, there is a need to have a polymer for resist material which exerts satisfactory performance with respect to sensitivity and resolution, has practically acceptable etching resistance, good adhesion to substrates and affinity to liquid developers.

SUMMARY OF THE INVENTION

An object of the invention is to provide a novel polymer for use in a resist composition which satisfies sensitivity, resolution, etch resistance, substrate adhesion and developer affinity when processed by photolithography using light with a wavelength of up to 300 nm, especially ArF excimer laser light as the light source. Another object of the invention is to provide a resist composition comprising the polymer as a base resin, and a patterning process.

The inventor has found that a polymer comprising recurring units of the general formulae (1) and (2), shown below, and having a weight average molecular weight of 1,000 to 50,000 is an effective resin for use in resist compositions, and that a resist composition comprising the polymer as a base resin has a high resolution and etch resistance, is improved in necessary properties such as adhesion to substrates and affinity to liquid developers, and lends itself to micropatterning.

In one aspect, the present invention provides a polymer comprising recurring units having the general formulae (1) and (2), the recurring units being of at least one type for each formula, and having a weight average molecular weight of 1,000 to 50,000.

Herein $R^1$ and $R^3$ are independently hydrogen or methyl, $R^4$ is a straight, branched or cyclic alkylene group of 1 to 20 carbon atoms, which may be substituted with at least one oxygen-containing functional group and/or have at least one oxygen atom intervening in a carbon-to-carbon bond, $R^2$ is an acid labile group selected from the general formulae ($R^2$-1) to ($R^2$-7):

-continued

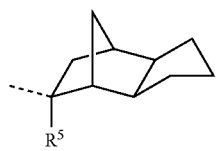 (R²-3)

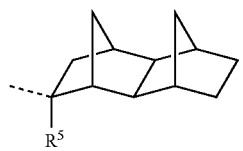 (R²-4)

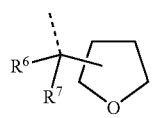 (R²-5)

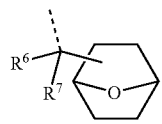 (R²-6)

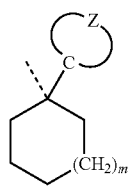 (R²-7)

wherein the broken line indicates a bonding site or direction, $R^5$ is each independently a straight, branched or cyclic alkyl group of 1 to 10 carbon atoms, $R^6$ and $R^7$ are each independently a straight, branched or cyclic alkyl group of 1 to 10 carbon atoms, or $R^6$ and $R^7$, taken together, may form a ring with the carbon atom to which they are attached, Z is a divalent hydrocarbon group of 2 to 20 carbon atoms which forms a single ring or bridged ring with the carbon atom to which it is attached and which may contain an oxygen atom, and m is 0 or 1.

The present invention also provides a polymer comprising recurring units having the general formulae (1) to (3), the recurring units being of at least one type for each formula, and having a weight average molecular weight of 1,000 to 50,000.

lp;1p

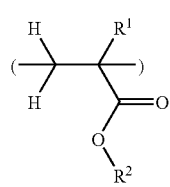 (1)

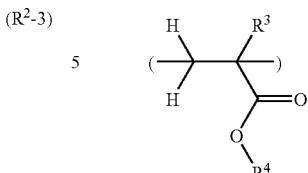 (2)

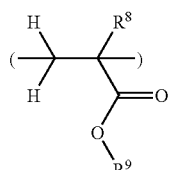 (3)

Herein $R^1$, $R^3$ and $R^8$ are independently hydrogen or methyl; $R^2$ and $R^4$ are as defined above; and $R^9$ is a group having a lactone structure.

The present invention further provides a polymer comprising recurring units having the general formulae (1) to (4), the recurring units being of at least one type for each formula, and having a weight average molecular weight of 1,000 to 50,000.

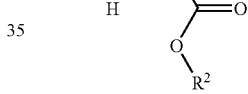 (1)

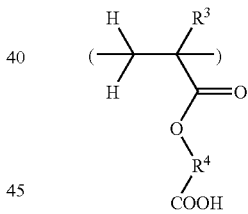 (2)

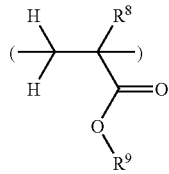 (3)

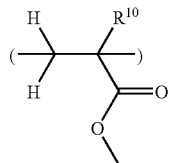 (4)

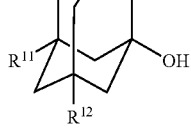

Herein $R^1$, $R^3$, $R^8$ and $R^{10}$ are independently hydrogen or methyl; $R^2$, $R^4$ and $R^9$ are as defined above; $R^{11}$ and $R^{12}$ are independently hydrogen or hydroxyl.

Still further the present invention provides a polymer comprising recurring units having the general formulae (1), (2), (4) and (5), the recurring units being of at least one type for each formula, and having a weight average molecular weight of 1,000 to 50,000.

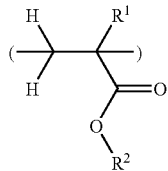
(1)

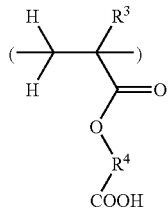
(2)

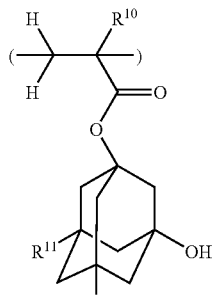
(4)

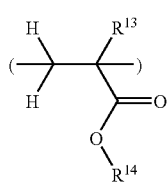
(5)

Herein $R^1$, $R^3$, $R^{10}$ and $R^{13}$ are independently hydrogen or methyl; $R^2$, $R^4$, $R^{11}$ and $R^{12}$ are as defined above; and $R^{14}$ is a lactone structure-containing group selected from the general formulae ($R^{14}$-1) to ($R^{14}$-5):

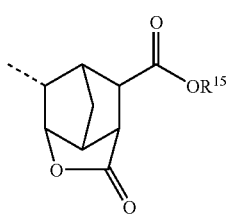
($R^{14}$-1)

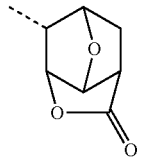
($R^{14}$-2)

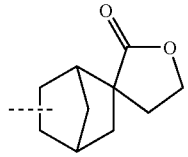
($R^{14}$-3)

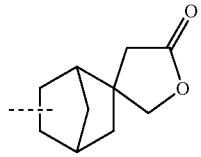
($R^{14}$-4)

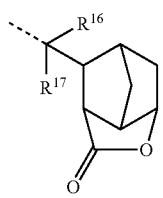
($R^{14}$-5)

wherein the broken line indicates a bonding site, $R^{15}$ is a straight, branched or cyclic alkyl group of 1 to 10 carbon atoms, $R^{16}$ and $R^{17}$ are each independently hydrogen or a straight, branched or cyclic alkyl group of 1 to 10 carbon atoms, or $R^{16}$ and $R^{17}$, taken together, may form a ring with the carbon atom to which they are attached.

In preferred embodiments of the foregoing polymers, the recurring units of each formula have a molar fraction of at least 3%.

In another aspect, the present invention provides a resist composition comprising any one of the polymers defined above.

In a further aspect, the present invention provides a pattern forming process comprising the steps of applying the resist composition onto a substrate to form a coating; heat treating the coating and then exposing it to high-energy radiation having a wavelength of up to 300 nm or electron beam through a photomask; and heat treating the exposed coating and developing it with a developer.

As discussed above, in general, copolymers of acrylic or methacrylic acid derivatives are very low in dry etching resistance and for overcoming this drawback, must have introduced therein a noticeable amount of units containing an alicyclic structure as typified by adamantane structure. However, the resulting polymer becomes highly hydrophobic as a whole, detracting from substrate adhesion and liquid developer affinity.

Expecting that such a polymer is endowed with a good profile of rigidity and hydrophilicity by introducing not only polycyclic structure units, but also recurring units having a high polarity, the inventors have found that the above objects are achieved using recurring units having the general formula (1) along with recurring units having the general formula (2).

The recurring units of formula (1) have an alicyclic structure and when introduced in a sufficient amount, exert a practically acceptable level of dry etching resistance. The recurring units of formula (1) have a very high acid-labile reactivity and contribute to a high sensitivity and resolution. Although introducing polar groups having a low carbon density generally detracts from dry etching resistance, recurring units of formula (2) having an extremely high hydrophilicity can reduce the hydrophobicity of a polymer when introduced in moderate amounts, enabling to provide etch resistance, substrate adhesion and liquid developer affinity at the same time.

Accordingly, a resist composition comprising as a base resin a polymer comprising recurring units of formulae (1) and (2) has high etch resistance and improved substrate adhesion and developer affinity as well as a high sensitivity and resolution, and lends itself to micropatterning.

The polymer of the invention, when used as a base resin in a resist composition, especially chemically amplified positive resist composition, exhibits a high sensitivity, resolution and etch resistance and offers improved substrate adhesion and developer affinity.

DESCRIPTION OF THE PREFERRED EMBODIMENTS

The novel high-molecular weight compound or polymer of the invention is defined as comprising recurring units having the general formulae (1) and (2), the recurring units being of at least one type for each formula. The polymer should have a weight average molecular weight of 1,000 to 50,000.

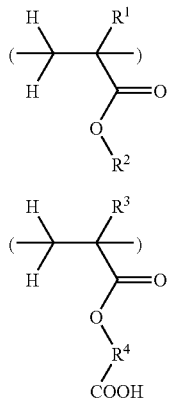

(1)

(2)

Herein $R^1$ and $R^3$ are independently hydrogen or methyl. $R^4$ is a straight, branched or cyclic alkylene group of 1 to 20 carbon atoms, which may be substituted with an oxygen-containing functional group and/or have an oxygen atom intervening in a carbon-to-carbon bond. $R^2$ is an acid labile group selected from the general formulae ($R^2$-1) to ($R^2$-7).

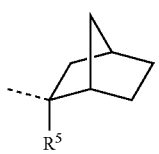 ($R^2$-1)

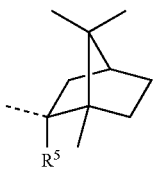 ($R^2$-2)

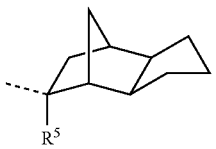 ($R^2$-3)

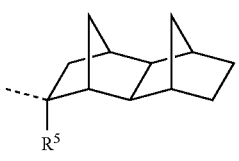 ($R^2$-4)

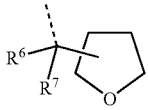 ($R^2$-5)

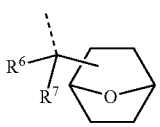 ($R^2$-6)

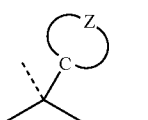 ($R^2$-7)

Herein the broken line indicates a bonding site or direction. $R^5$ is each independently a straight, branched or cyclic alkyl group of 1 to 10 carbon atoms. Examples of $R^5$ include methyl, ethyl, propyl, isopropyl, n-butyl, sec-butyl, tert-butyl, tert-amyl, n-pentyl, n-hexyl, cyclopentyl and cyclohexyl.

$R^6$ and $R^7$ are each independently a straight, branched or cyclic alkyl group of 1 to 10 carbon atoms, or $R^6$ and $R^7$, taken together, may form a ring with the carbon atom to which they are attached. Suitable rings include those having 3 to 20 carbon atoms, especially 3 to 10 carbon atoms, for example, cyclopentyl and cyclohexyl.

Z is a divalent hydrocarbon group of 2 to 20 carbon atoms which forms a single ring or bridged ring with the carbon atom to which it is attached and which may contain an oxygen atom. Examples include hydrocarbon groups forming single rings such as cyclopropane, cyclobutane, cyclopentane, cyclohexane, cycloheptane and cyclooctane; hydrocarbon groups forming bridged rings such as bicyclo[2.2.1]heptane, bicyclo[2.2.2]octane, bicyclo[4.4.0]decane, and tricyclo[5.2.1.0$^{2,6}$]decane; and ring-forming hydrocarbon groups in which some hydrogen atoms on the foregoing groups are replaced by such groups as alkyl, hydroxy, alkoxy, acyloxy, alkylcarbonyl, hydroxycarbonyl, alkoxycarbonyl or oxo groups.

The letter m is 0 or 1.

For the groups of formulae (R²-1) to (R²-4), there exist enantiomers and diastereomers. Each of formulae (R²-1) to (R²-4) collectively represents all such steric isomers. Such steric isomers may be included alone or in admixture.

For example, the general formula (R²-3) collectively represents one or a mixture of groups having the following general formulae (R²-3-1) and (R²-3-2).

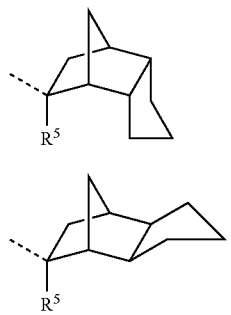

(R²-3-1)

(R²-3-2)

Herein the broken line indicates a bonding site or direction, and R⁵ is as defined above.

Also, the general formula (R²-4) collectively represents one or a mixture of groups having the following general formulae (R²-4-1) to (R²-4-4).

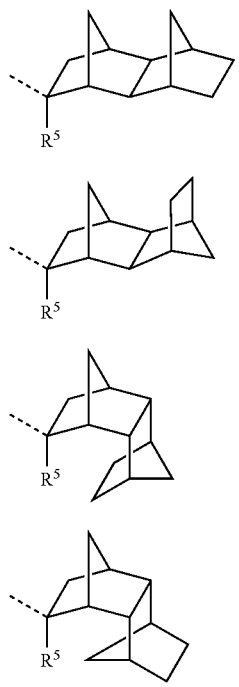

(R²-4-1)

(R²-4-2)

(R²-4-3)

(R²-4-4)

Herein the broken line indicates a bonding site or direction, and R⁵ is as defined above.

It should be understood that the formulae (R²-1) to (R²-4) and the formulae (R²-3-1), (R²-3-2), (R²-4-1) to (R²-4-4) each collectively represent an enantiomer thereof and a mixture of enantiomers.

The direction of a valence bond of the group represented by the formulae (R²-1) to (R²-4) and the formulae (R²-3-1), (R²-3-2), (R²-4-1) to (R²-4-4) is on the exo side relative to the bicyclo[2.2.1]heptane ring, which ensures high reactivity in acid-catalyzed elimination reaction (see JP-A 2000-336121). When a monomer substituted with a tertiary exo-alkyl group having a bicyclo[2.2.1]heptane skeleton is prepared, the product may also include a monomer substituted with an endo-alkyl group represented by the following general formulae (R²-1-endo) to (R²-4-endo). To ensure satisfactory reactivity, the exo proportion is preferably at least 50 mol %, and more preferably at least 80 mol % of the product.

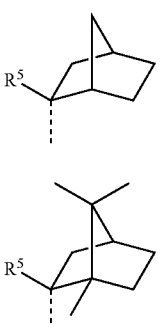

(R²-1-endo)

(R²-2-endo)

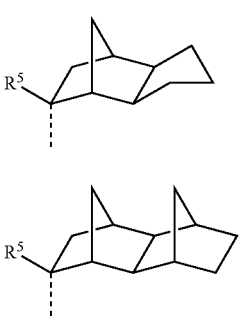

(R²-3-endo)

(R²-4-endo)

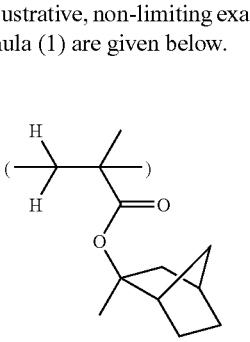

Herein the broken line indicates a bonding site or direction, and R⁵ is as defined above.

Illustrative, non-limiting examples of the recurring units of formula (1) are given below.

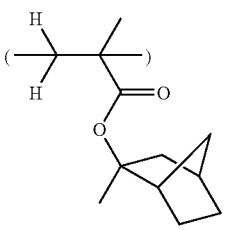 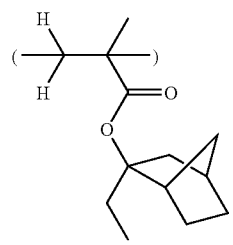

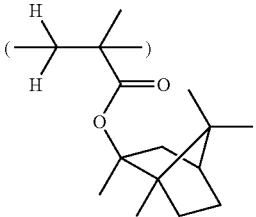 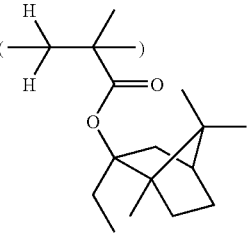

-continued
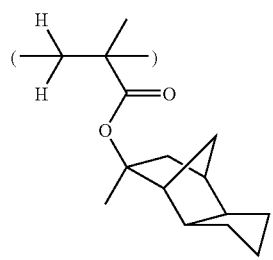
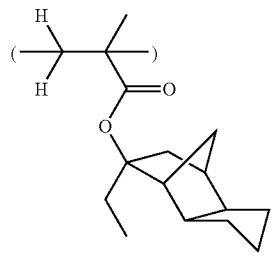
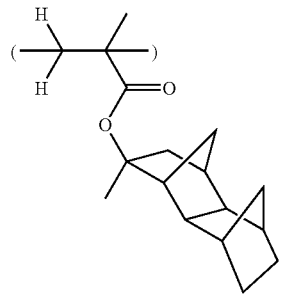
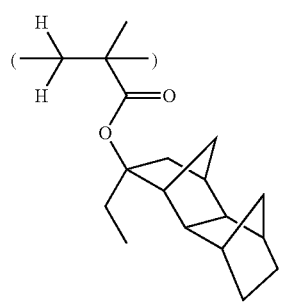
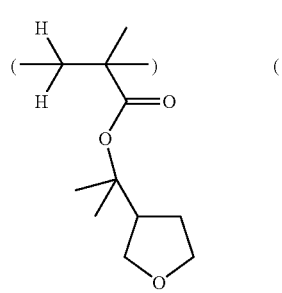
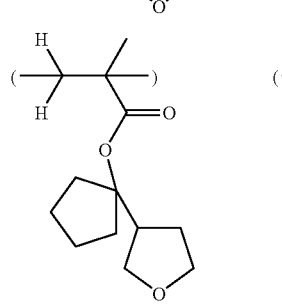
-continued
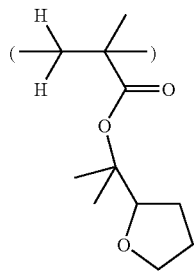
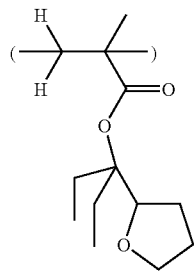
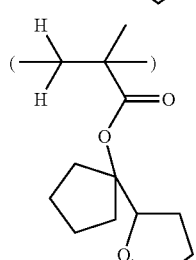
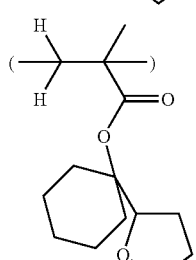
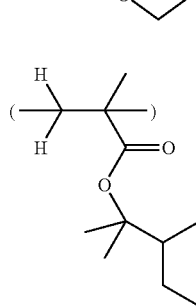
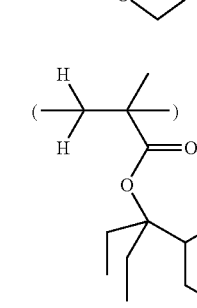
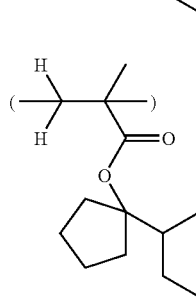
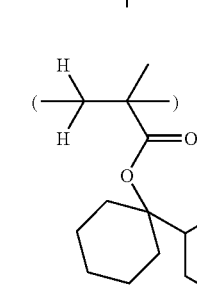
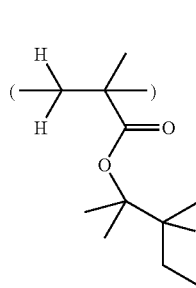
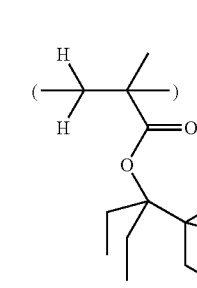
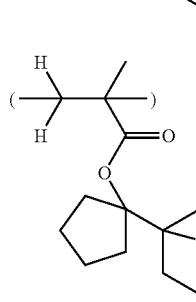
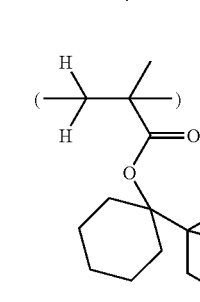

-continued
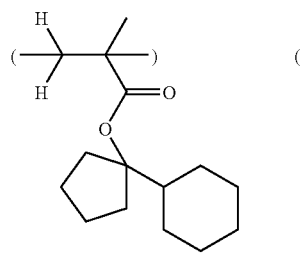 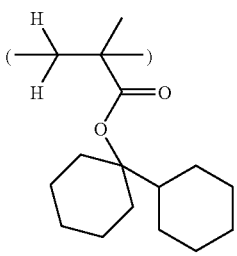
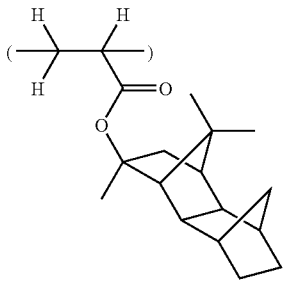
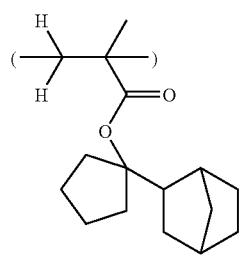
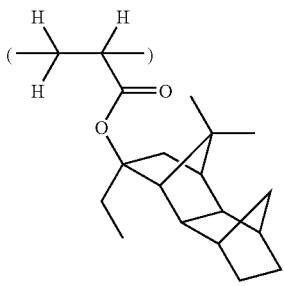
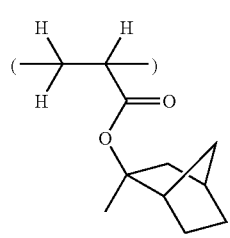
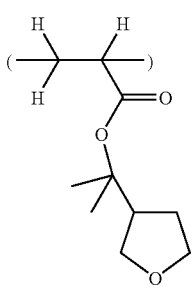 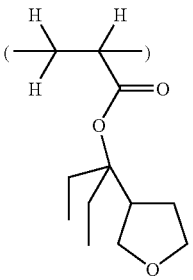
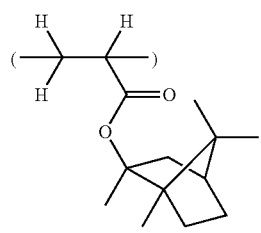 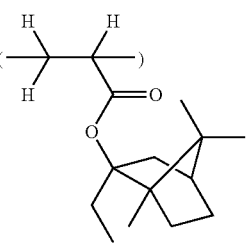
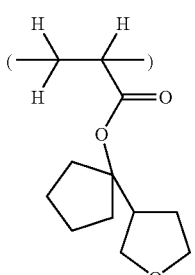
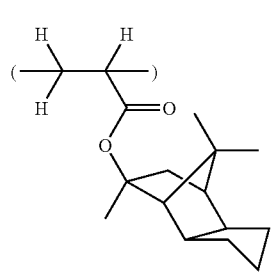
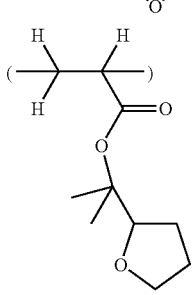
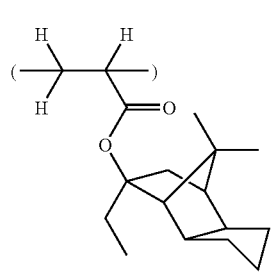
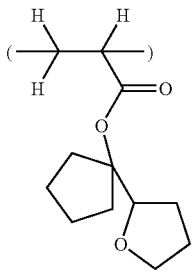 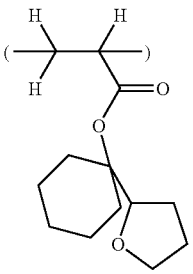

-continued

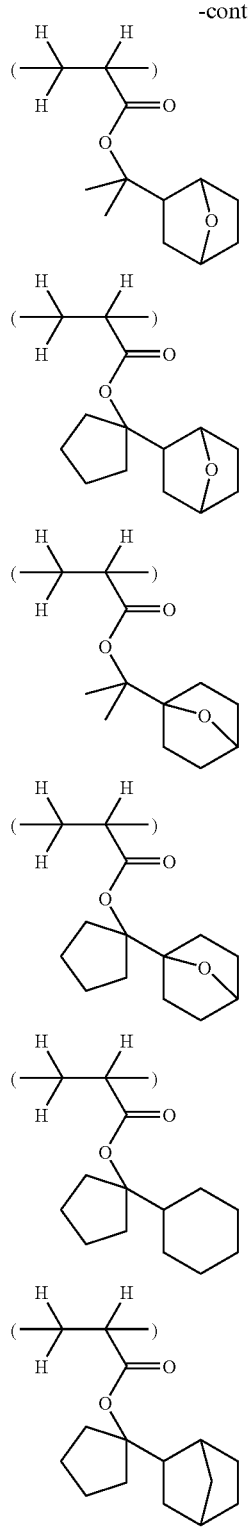

In formula (2), R⁴ is a straight, branched or cyclic alkylene group of 1 to 20 carbon atoms, preferably 1 to 15 carbon atoms, in which hydrogen atoms may be replaced by an oxygen-containing functional group such as oxygen of carbonyl (=O) and/or which may have an oxygen atom intervening in a carbon-to-carbon bond.

Illustrative, non-limiting examples of the recurring units of formula (2) are given below.

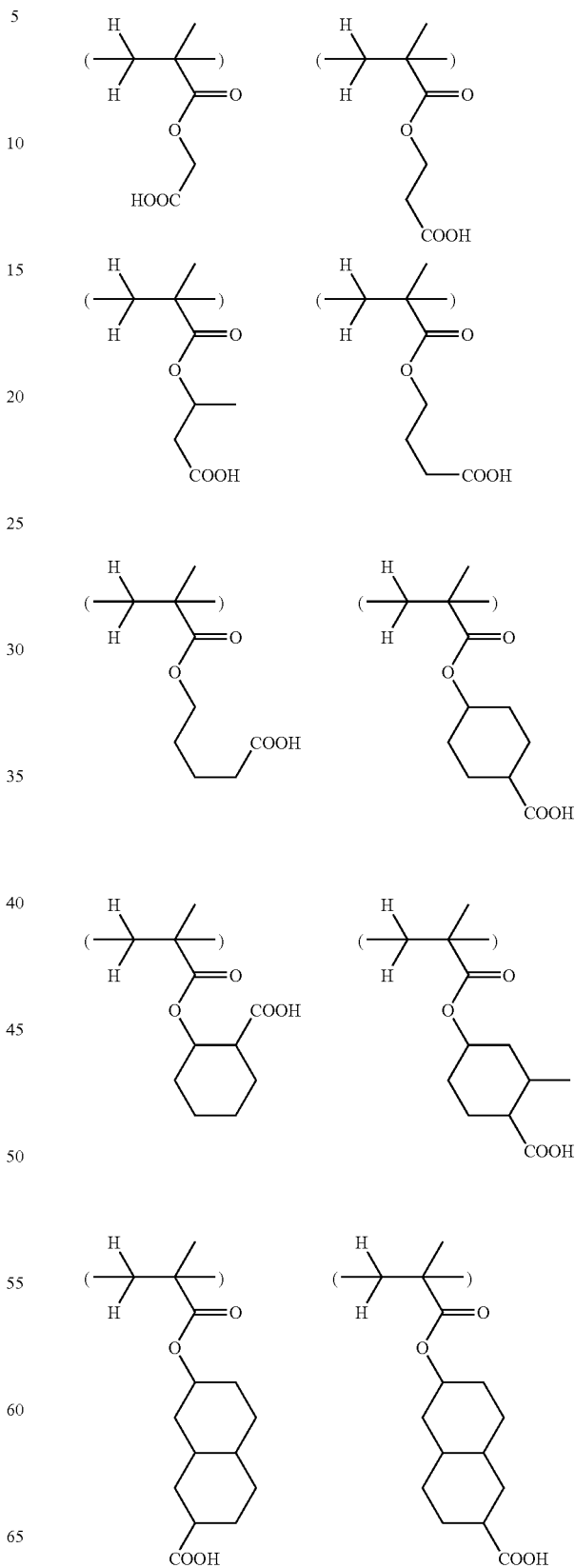

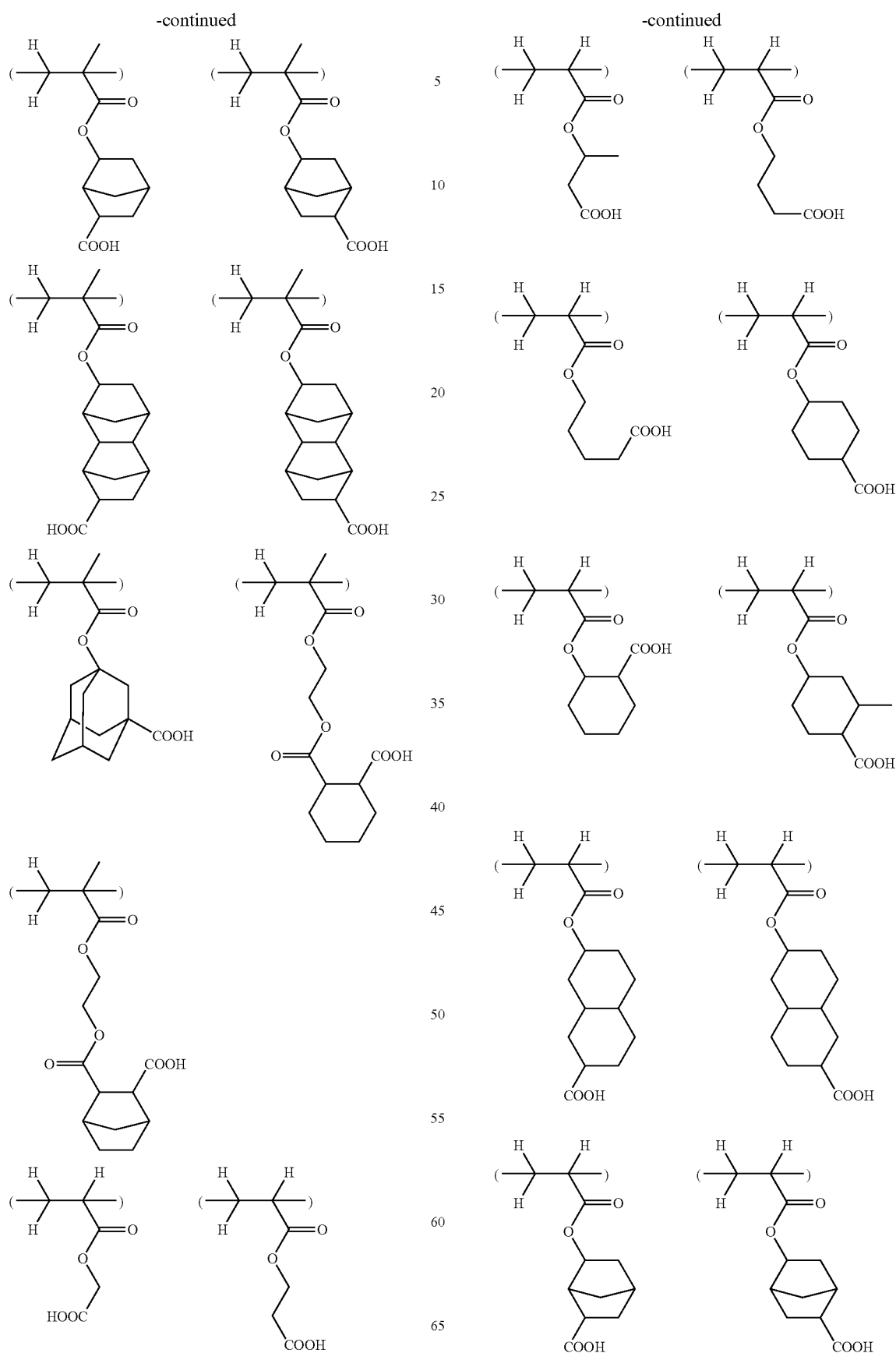

-continued

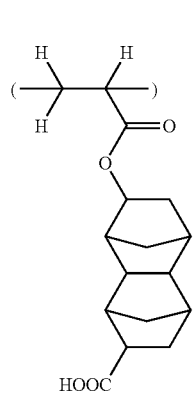 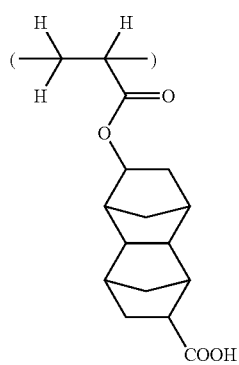

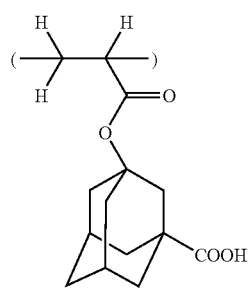 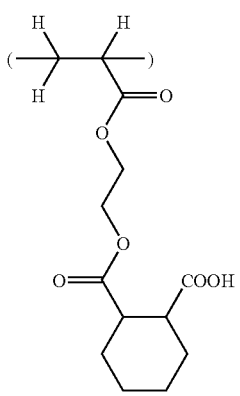

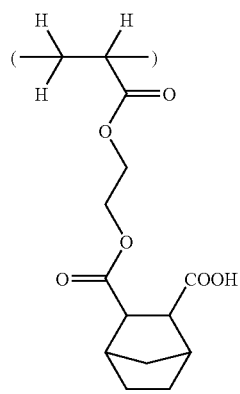

In a preferred embodiment, the polymer of the invention comprises recurring units having the general formulae (1) to (3), the recurring units being of at least one type for each formula. The polymer should have a weight average molecular weight of 1,000 to 50,000.

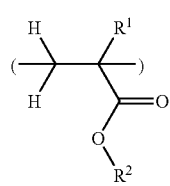
(1)

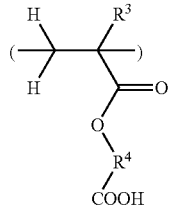
(2)

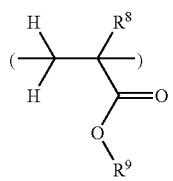
(3)

Herein $R^1$, $R^3$ and $R^8$ are independently hydrogen or methyl. $R^2$ and $R^4$ are as defined above. $R^9$ is a group having a lactone structure.

Illustrative, non-limiting examples of the recurring units of formula (3) are given below.

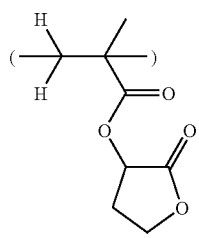 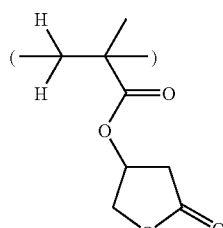

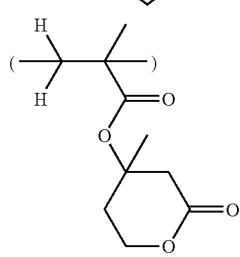

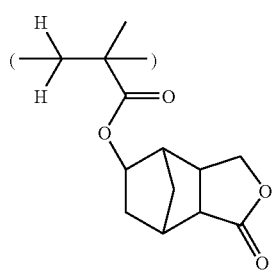

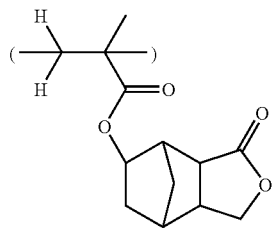

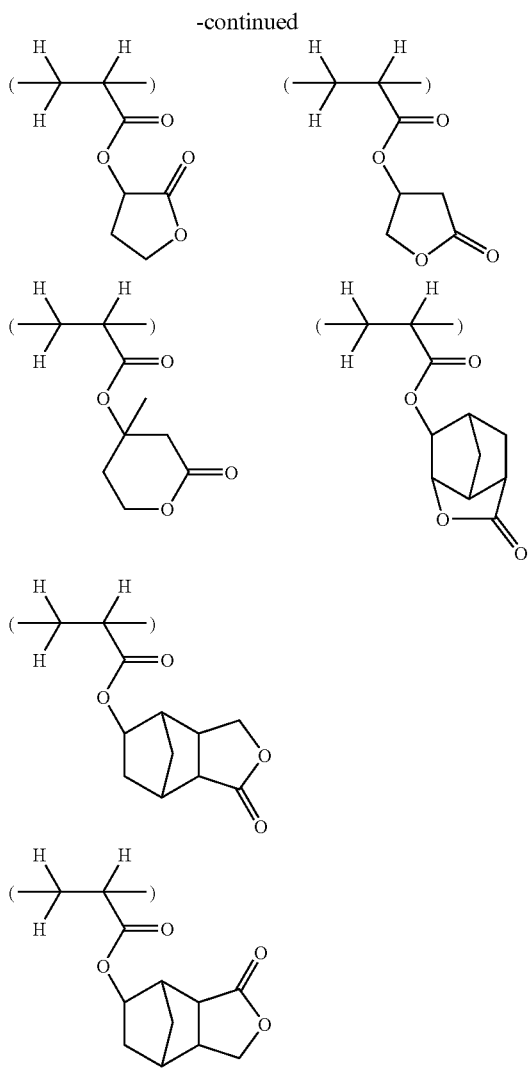

In another preferred embodiment, the polymer of the invention comprises recurring units having the general formulae (1) to (4), the recurring units being at least one type for each formula. The polymer should have a weight average molecular weight of 1,000 to 50,000.

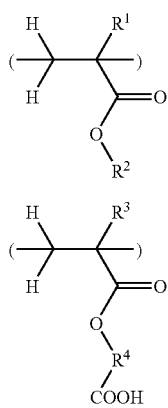

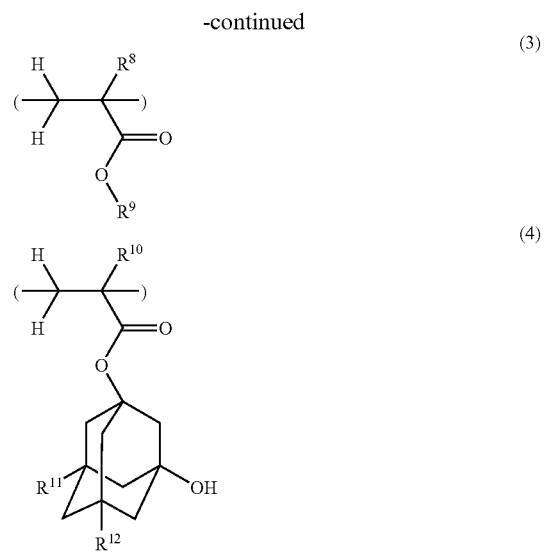

Herein $R^1$, $R^3$, $R^8$ and $R^{10}$ are independently hydrogen or methyl. $R^2$, $R^4$ and $R^9$ are as defined above. $R^{11}$ and $R^{12}$ are independently a hydrogen atom or hydroxyl group.

Illustrative, non-limiting examples of the recurring units of formula (4) are given below.

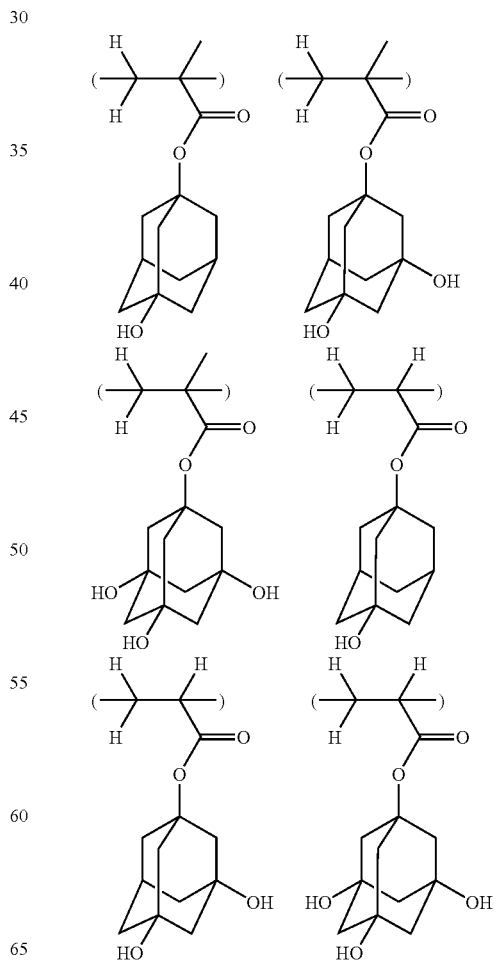

In a further preferred embodiment, the polymer of the invention comprises recurring units having the general formulae (1), (2), (4) and (5), the recurring units being of at least one type for each formula. The polymer should have a weight average molecular weight of 1,000 to 50,000.

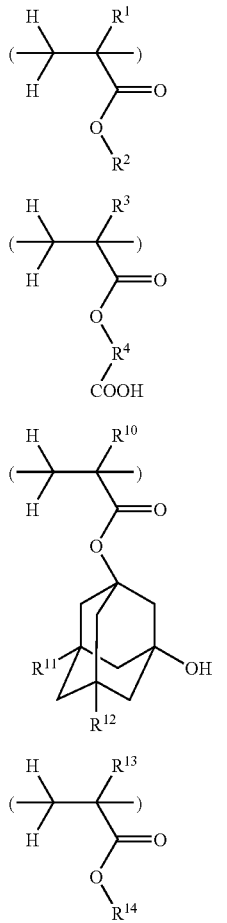

Herein $R^1$, $R^3$, $R^{10}$ and $R^{13}$ are independently hydrogen or methyl. $R^2$, $R^4$, $R^{11}$ and $R^{12}$ are as defined above. $R^{14}$ is a lactone structure-containing group selected from the general formulae ($R^{14}$-1) to ($R^{14}$-5).

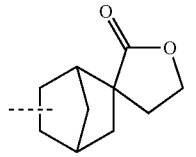

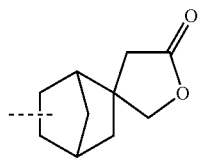

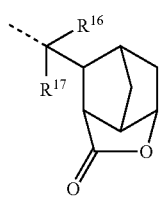

Herein the broken line indicates a bonding site. $R^{15}$ is a straight, branched or cyclic alkyl group of 1 to 10 carbon atoms. Examples of $R^{15}$ include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, and adamantyl. $R^{16}$ and $R^{17}$ are each independently hydrogen or a straight, branched or cyclic alkyl group of 1 to 10 carbon atoms, or $R^{16}$ and $R^{17}$, taken together, may form a ring with the carbon atom to which they are attached. Examples of suitable straight, branched or cyclic $C_1$-$C_{10}$ alkyl groups represented by $R^{16}$ and $R^{17}$ include methyl, ethyl, propyl, isopropyl, n-butyl, sec-butyl, tert-butyl, n-pentyl, n-hexyl, cyclohexyl and n-decyl. When $R^{16}$ and $R^{17}$ bond together to form a ring, suitable alkylene groups formed by $R^{16}$ and $R^{17}$ include ethylene, propylene, trimethylene and tetramethylene, and the rings include those having 3 to 20 carbon atoms, especially 3 to 10 carbon atoms.

Illustrative, non-limiting examples of the recurring units of formula (5) are given below.

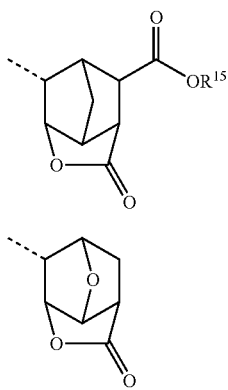

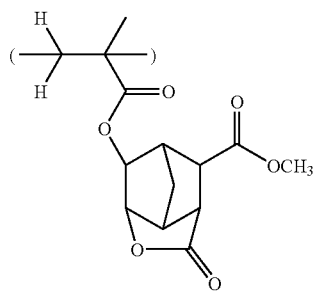

-continued
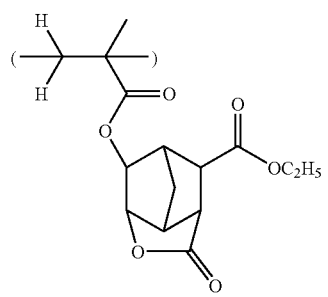
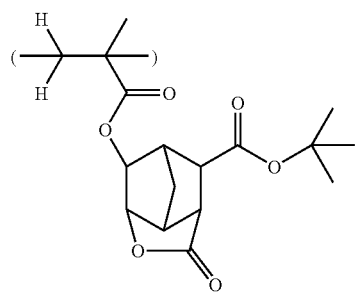
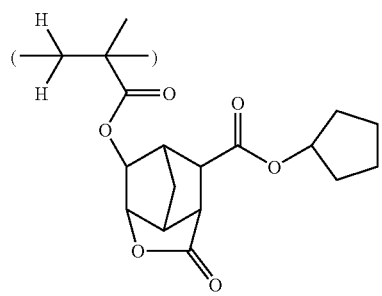
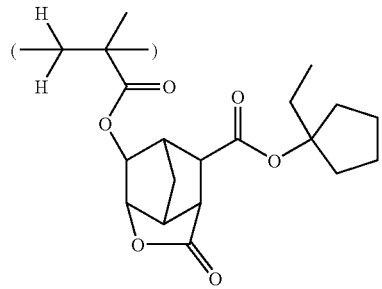
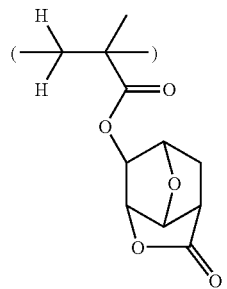
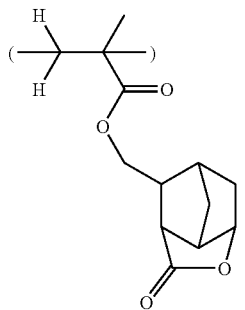
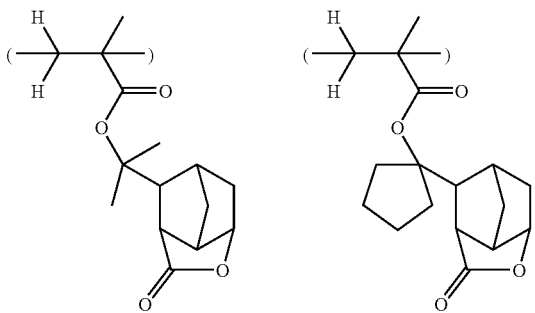
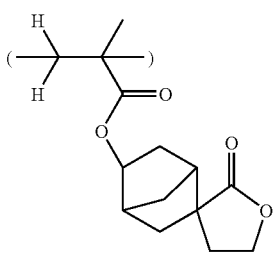
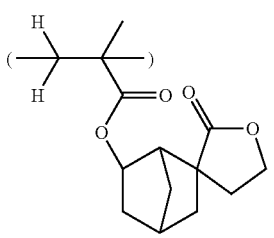
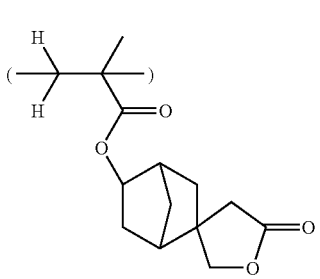
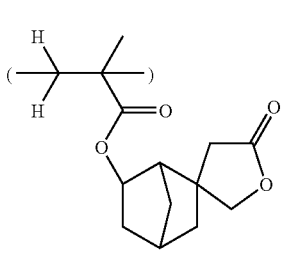
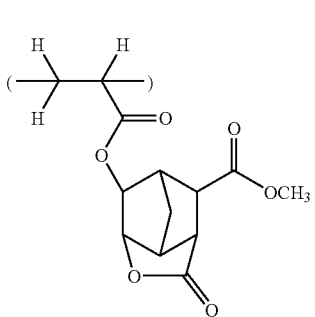

-continued

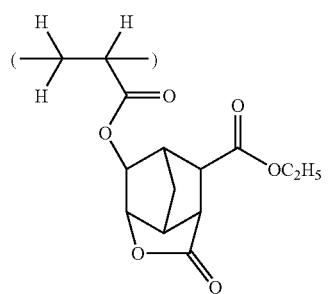
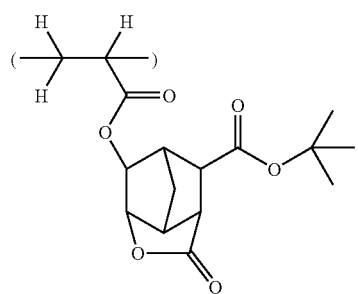
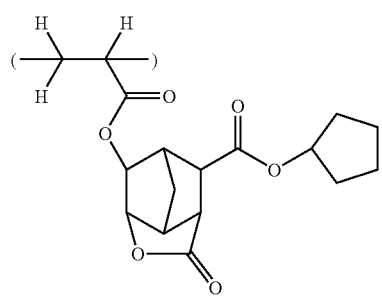
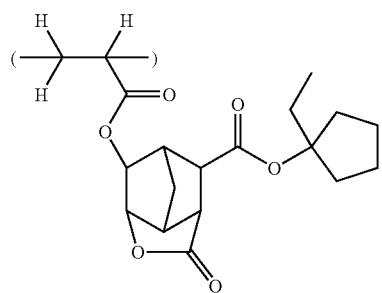
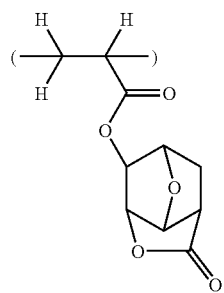

-continued

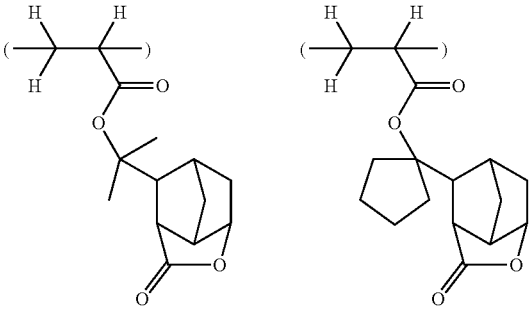
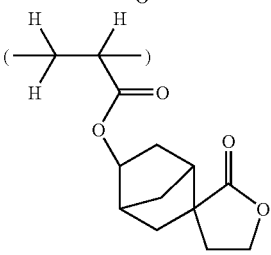
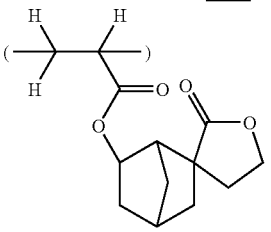
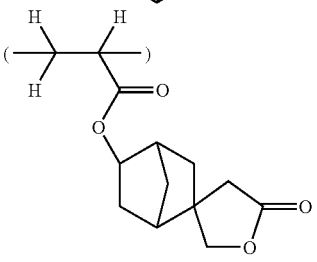
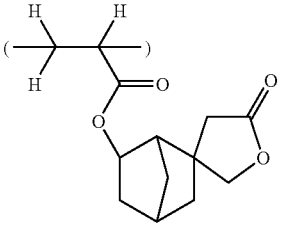

With respect to the recurring units of formulae (1) to (5), the polymers of the invention should preferably be such that the recurring units of each formula have a molar fraction of at least 3%, more preferably at least 5%, most preferably at least 8%.

The polymers of the invention should have a weight average molecular weight (Mw) of 1,000 to 50,000, preferably 2,000 to 30,000 as measured by gel permeation chromatography (GPC) relative to polystyrene standards. Outside the range, there may occur an extreme drop of etch resistance, an obscured contrast of dissolution rate before and after exposure and hence a decline of resolution.

The polymers of the invention can be prepared by copolymerization reaction using at least one monomer selected from compounds having the general formula (1a), at least one monomer selected from compounds having the general formula (2a), optionally at least one monomer selected from compounds having the general formula (3a) or (5a) and further optionally at least one monomer selected from compounds having the general formula (4a).

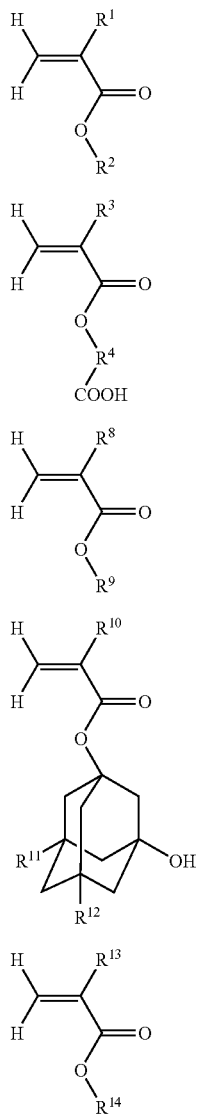

Herein, $R^1$ through $R^{14}$ are as defined above.

By suitably adjusting the proportion of the respective monomers in the copolymerization reaction, a polymer can be prepared that exerts better performance when formulated in a resist composition.

In addition to (i) at least one monomer selected from compounds having formula (1a), (ii) at least one monomer selected from compounds having formula (2a), (iii) at least one monomer selected from compounds having formula (3a) or (5a) and (iv) at least one monomer selected from compounds having formula (4a), the inventive polymer may have further copolymerized therein (v) at least one monomer having a carbon-to-carbon double bond other than (i) to (iv). Illustrative, non-limiting examples of the additional monomers include substituted acrylates such as methyl methacrylate, methyl crotonate, dimethyl maleate and dimethyl itaconate; unsaturated carboxylic acids such as maleic acid, fumaric acid and itaconic acid; substituted norbornenes such as norbornene and methyl norbornene-5-carboxylate; unsaturated acid anhydrides such as maleic anhydride and itaconic anhydride; α,β-unsaturated lactones such as 5,5-dimethyl-3-methylene-2-oxotetrahydrofuran, and the like.

In the polymers of the invention, the preferred proportions of respective recurring units derived from the foregoing monomers are in the following range though not limited thereto.

<1> When recurring units of one type having formula (1) derived from a monomer having formula (1a) are included, their proportion is 3 to 90 mol %, preferably 5 to 80 mol %, and more preferably 10 to 70 mol %. When recurring units of two or more types having formula (1) derived from monomers having formula (1a) are included, their total proportion is 3 to 90 mol %, preferably 5 to 80 mol %, and more preferably 10 to 70 mol %.

<2> When recurring units of one type having formula (2) derived from a monomer having formula (2a) are included, their proportion is 3 to 50 mol %, preferably 5 to 45 mol %, and more preferably 8 to 40 mol %. When recurring units of two or more types having formula (2) derived from monomers having formula (2a) are included, their total proportion is 3 to 50 mol %, preferably 5 to 45 mol %, and more preferably 8 to 40 mol %.

<3> When recurring units of one type having formula (3) derived from a monomer having formula (3a) are included, their proportion is 3 to 80 mol %, preferably 5 to 70 mol %, and more preferably 8 to 60 mol %. When recurring units of two or more types having formula (3) derived from monomers having formula (3a) are included, their total proportion is 3 to 80 mol %, preferably 5 to 70 mol %, and more preferably 8 to 60 mol %.

<4> When recurring units of one type having formula (4) derived from a monomer having formula (4a) are included, their proportion is 3 to 80 mol %, preferably 5 to 70 mol %, and more preferably 8 to 60 mol %. When recurring units of two or more types having formula (4) derived from monomers having formula (4a) are included, their total proportion is 3 to 80 mol %, preferably 5 to 70 mol %, and more preferably 8 to 60 mol %.

<5> When recurring units of one type-having formula (5) derived from a monomer having formula (5a) are included, their proportion is 3 to 80 mol %, preferably 5 to 70 mol %, and more preferably 8 to 60 mol %. When recurring units of two or more types having formula (5) derived from monomers having formula (5a) are included, their total proportion is 3 to 80 mol %, preferably 5 to 70 mol %, and more preferably 8 to 60 mol %.

<6> When recurring units of one type derived from an additional monomer are included, their proportion is 0 to 60 mol %, preferably 0 to 40 mol %, and more preferably 0 to 30 mol %. When recurring units of two or more types derived from additional monomers are included, their total proportion is 0 to 60 mol %, preferably 0 to 40 mol %, and more preferably 0 to 30 mol %.

Monomers having formula (1a) from which units having formula (1) essentially included in the inventive polymer are derived can be prepared by well-known organochemical procedures. Monomers having substituent groups of formulae ($R^2$-1) to ($R^2$-4) can be prepared by the method described in JP-A 2000-336121. Monomers having substituent groups of formulae ($R^2$-5) and ($R^2$-6) can be prepared by the method described in JP-A 2004-143153. Monomers having a substituent group of formulae ($R^2$-7) can be prepared by the method described in JP-A 2002-003537. Monomers having formula (2a) from which units having formula (2) essentially included in the inventive polymer are derived can be prepared by well-known organochemical procedures. Monomers having formula (3a) from which units having formula (3) are derived are commercially available or can be prepared by well-known organochemical procedures. Monomers having formula (4a) from which units having formula (4) are derived are commercially available or can be prepared by well-known organochemical procedures. Monomers having formula (5a) from which units having formula (5) are derived can be prepared by well-known organochemical procedures. Monomers having substituent groups of formulae ($R^{14}$-1) and ($R^{14}$-2) can be prepared by the method described in JP-A 2000-159758. Monomers having substituent groups of formulae ($R^{14}$-3) and ($R^{14}$-4) can be prepared by the method described in JP-A 2002-371114. Monomers having a substituent group of formulae ($R^{14}$-5) can be prepared by the method described in JP-A 2003-2883 and JP-A 2004-115486.

The polymer can be synthesized by a variety of copolymerization reactions, preferably radical polymerization. Preferred conditions for the radical polymerization include (a) solvents, for example, hydrocarbons such as benzene, ethers such as tetrahydrofuran, alcohols such as ethanol and ketones such as methyl isobutyl ketone; (b) polymerization initiators, for example, azo compounds such as 2,2'-azobisisobutyronitrile and dimethyl-2,2'-azobis(2-methylpropionate) and peroxides such as benzoyl peroxide and lauroyl peroxide; (c) reaction temperatures in the range of about 0° C. to about 100° C.; and reaction times in the range of about 0.5 to about 48 hours. The reaction can be effected outside the ranges, with the results being acceptable.

Resist Composition

Advantageously, the polymer of the invention is used as a base resin in a resist composition, especially a chemically amplified positive resist composition. Therefore, the present invention in the second aspect provides a resist composition, especially a chemically amplified positive resist composition, comprising the above-described polymer as a base resin.

The chemically amplified positive resist composition is typically comprised of (A) the above-described polymer as a base resin, (B) a photoacid generator, and (C) an organic solvent. Optionally, the resist composition further includes (D) an acid amplifier compound, (E) another polymer other than component (A) (if used, the base resin in the resist composition consists of components (A) and (E)), (F) a dissolution regulator, (G) a nitrogen-containing organic compound or basic compound, (H) a compound having a group ≡C—COOH in a molecule, (I) an acetylene alcohol derivative, and (J) a surfactant.

Photoacid Generator

The photoacid generator may be any compound capable of generating an acid upon exposure to high energy radiation or electron beam. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo

[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycinol, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are as described in Japanese Patent No. 2,906,999 and JP-A 9-301948. Examples include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenyl-acetonitrile, (5-(10-camphorsulfonyl)oxyimino-5H-thiophen-2-ylidene)phenyl-acetonitrile, (5-n-octanesulfonyloxyimino-5H-thiophen-2-ylidene)phenyl-acetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methyl-sulfonate; 2,2,2-trifluoro-1-(2-methylphenyl)-ethanone oxime-O-(10-camphoryl)sulfonate; 2,2,2-trifluoro-1-(2,4-dimethyl-phenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethyl-phenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethyl-phenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methyl-sulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl) sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxy-phenyl)-2,2,2-trifluoroethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H, 7H-5,8-dioxonaphth-2-yl]-ethanone oxime-O-propylsulfonate; 2,2,2-trifluoro-1-[4-methoxy-carbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxy-phenyl]-ethanone oxime-O-propylsulfonate; 2,2,2-trifluoro-1-[2-thiophenyl]-ethanone oxime-O-propylsulfonate; and 2,2,2-trifluoro-1-[1-dioxathiophen-2-yl)]-ethanone oxime-O-propylsulfonate.

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]-acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Suitable bisoxime sulfonates include those described in JP-A 9-208554, for example, bis(α-(4-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(4-toluenesulfonyloxy)imino)-p-phenylenediacetonitrile, bis(α-(trifluoromethanesulfonyloxy)imino)-p-phenylene-diacetonitrile, bis(α-(4-methoxybenzenesulfonyloxy)imino)-p-phenylene-diacetonitrile, bis(α-(4-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy)imino)-m-phenylene-diacetonitrile, bis(α-(4-methoxybenzenesulfonyloxy)imino)-m-phenylene-diacetonitrile, etc.

Of the photoacid generators, sulfonium salts, bissulfonyldiazomethanes, N-sulfonyloxyimides and glyoxime derivatives are preferred, with the sulfonium salts, bissulfonyldiazomethanes, and N-sulfonyloxyimides being most preferred. Illustrative examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyl-oxy)benzenesulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, bis(4-tert-butylphenylsulfonyl)diazomethane, N-camphorsulfonyloxy-5-norbornene-2,3-dicarboxylic acid imide, and N-p-toluenesulfonyloxy-5-norbornene-2,3-dicarboxylic acid imide.

In the chemically amplified resist composition of the invention, the photoacid generator may be added in any desired amount, typically from more than 0 to 10 parts, preferably from more than 0 to 5 parts by weight, per 100 parts by weight of the base resin in the composition. Excessive amounts of the photoacid generator may degrade resolution and give rise to a problem of foreign matter during development and resist peeling. The photoacid generators may be used alone or in admixture. It is also possible to use a photoacid generator having a low transmittance at the exposure wavelength in a controlled amount so as to adjust the transmittance of a resist coating.

Acid-Amplifier

In the resist composition of the invention, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl 2-methyl-2-tosyloxymethylacetoacetate and 2-phenyl 2-(2-tosyloxyethyl)-1,3-dioxolane, but are not limited thereto. Of well-known photoacid generators, many of those compounds having poor stability, especially poor thermal stability exhibit an acid-amplifier compound-like behavior.

In the resist composition of the invention, an appropriate amount of the acid-amplifier compound is up to 2 parts, and especially up to 1 part by weight per 100 parts by weight of the base resin in the composition. Excessive amounts of the acid-amplifier compound makes diffusion control difficult, leading to degradation of resolution and pattern profile.

Solvent

The organic solvent used herein may be any organic solvent in which the base resin, photoacid generator, and other components are soluble. Illustrative, non-limiting, examples of the organic solvent include ketones such as cyclohexanone and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, or a mixture thereof because the photoacid generator is most soluble therein. An appropriate amount of the organic solvent used is about 200 to 1,000 parts, especially about 400 to 800 parts by weight per 100 parts by weight of the base resin.

Other Polymer

To the resist composition of the invention, another polymer other than the inventive polymer may also be added. The other polymers that can be added to the resist composition are, for example, those polymers comprising units of the following formula (R1) or (R2) and having a weight average molecular weight of about 1,000 to about 50,000, especially about 3,000 to about 30,000 although the other polymers are not limited thereto.

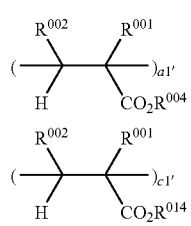
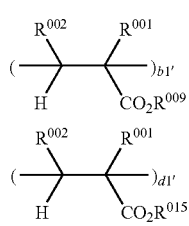
(R1)

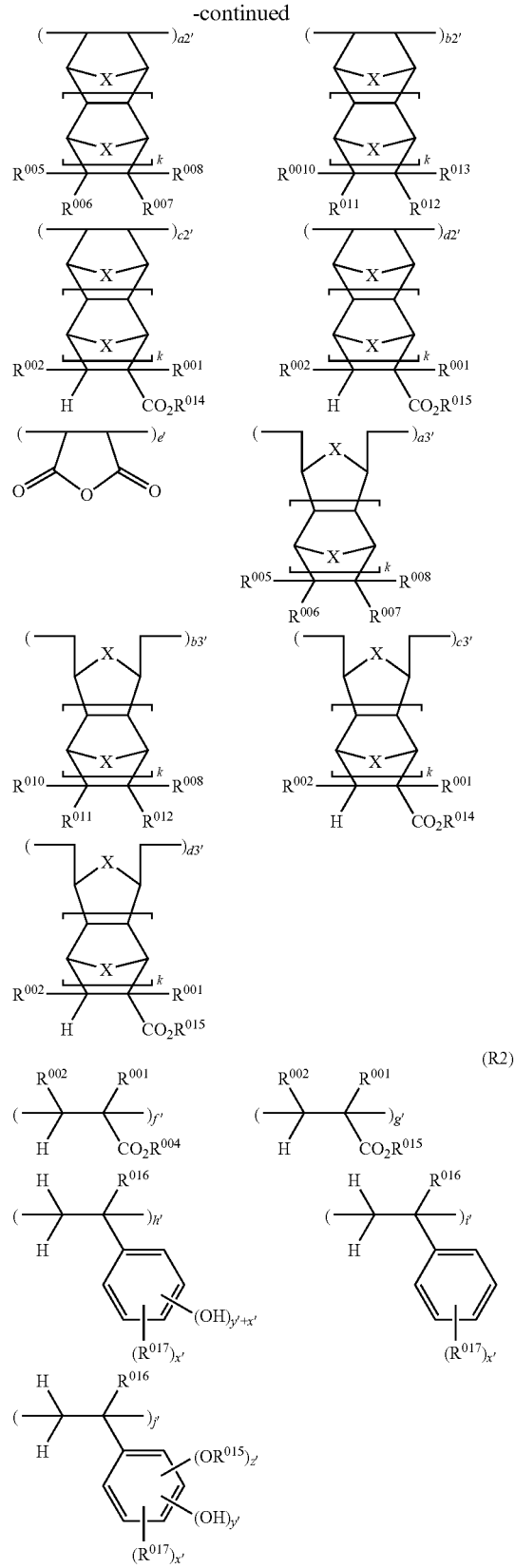

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic alkyl group of 1 to 15 carbon atoms. $R^{004}$ is hydrogen or a monovalent hydrocarbon group of 1 to 15 carbon atoms having a carboxyl or hydroxyl group. At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. $R^{009}$ is a monovalent hydrocarbon group of 3 to 15 carbon atoms containing a —$CO_2$— partial structure. At least one of $R^{010}$ to $R^{013}$ is a monovalent hydrocarbon group of 2 to 15 carbon atoms containing a —$CO_2$— partial structure, while the remaining R's are independently hydrogen or straight, branched or cyclic alkyl groups of 1 to 15 carbon atoms. $R^{010}$ to $R^{013}$, taken together, may form a ring, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic alkylene groups of 1 to 15 carbon atoms. $R^{014}$ is a polycyclic hydrocarbon group having 7 to 15 carbon atoms or an alkyl group containing a polycyclic hydrocarbon group. $R^{015}$ is an acid labile group. $R^{016}$ is hydrogen or methyl. $R^{017}$ is a straight, branched or cyclic alkyl group of 1 to 8 carbon atoms. X is $CH_2$ or an oxygen atom. Letter k' is 0 or 1; a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j'are numbers from 0 to less than 1, satisfying f'+g'+h'+i'+j'=1; x', y' and z' are each an integer of 0 to 3, satisfying $1 \leq x'+y'+z' \leq 5$ and $1 \leq y'+z' \leq 3$.

Examples of the respective groups are as previously described.

The inventive polymer and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Dissolution Regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

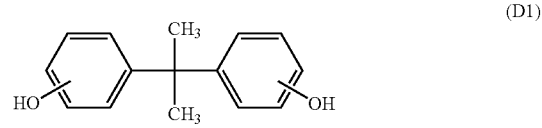

(D1)

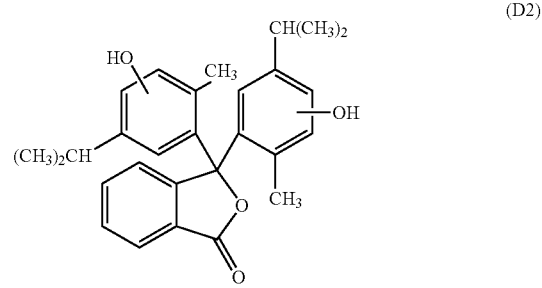

(D2)

(D3)

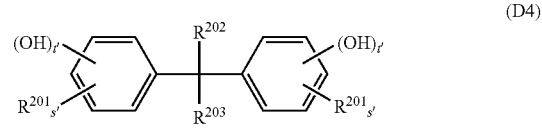

(D4)

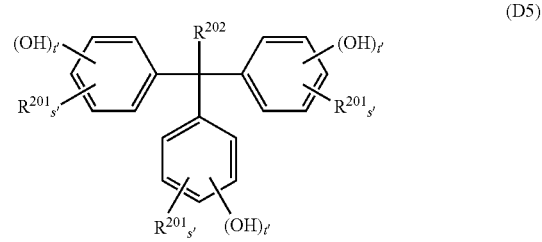

(D5)

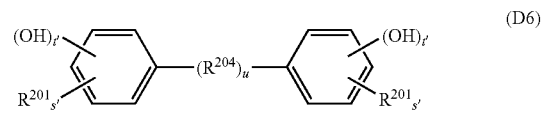

(D6)

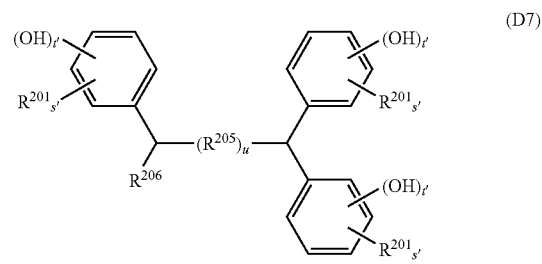

(D7)

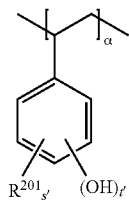 (D8)

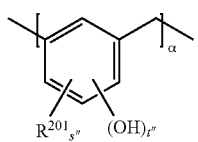 (D9)

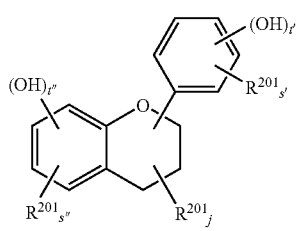 (D10)

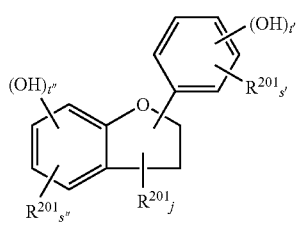 (D11)

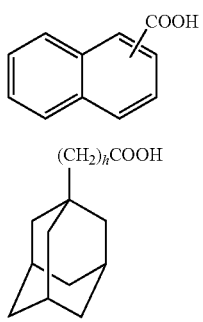 (D12)

(CH$_2$)$_h$COOH (D13)

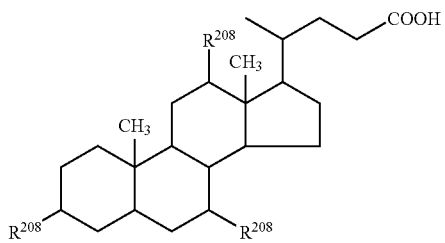 (D14)

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or —(R$^{207}$)$_h$—COOH; $R^{204}$ is —(CH$_2$)$_i$— (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and a is a number such that the compounds of formula (D8) or (D9) have a molecular weight of from 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —CH$_2$COOH; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

Exemplary acid labile groups on the dissolution regulator include groups of the following general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms.

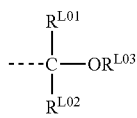 (L1)

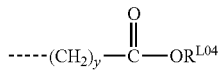 (L2)

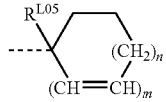 (L3)

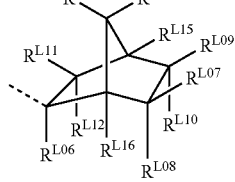 (L4)

In these formulas, the broken line indicates a bonding site or direction. $R^{L01}$ and $R^{L02}$ are each hydrogen or a straight, branched or cyclic alkyl having 1 to 18 carbon atoms; and $R^{L03}$ is a monovalent hydrocarbon group of 1 to 18 carbon atoms which may contain a heteroatom (e.g., oxygen). A pair of $R^{L01}$ and $R^{L02}$, a pair of $R^{L01}$ and $R^{L03}$, or a pair of R and $R^{L03}$ may together form a ring, with the proviso that $R^{L01}$, $R^{L02}$, and $R^{L03}$ are each a straight or branched alkylene of 1 to 18 carbon atoms when they form a ring. $R^{L04}$ is a tertiary alkyl group of 4 to 20 carbon atoms, a trialkysilyl group in which each of the alkyls has 1 to 6 carbon atoms, an oxoalkyl group of 4 to 20 carbon atoms, or a group of the formula (Li). $R^{L05}$ is a straight, branched or cyclic alkyl group of 1 to 8 carbon atoms which may contain a hetero atom or a substituted or unsubstituted aryl group of 6 to 20 carbon atoms. $R^{L06}$ is a straight, branched or cyclic alkyl group of 1 to 8 carbon atoms which may contain a hetero atom or a substituted or unsubstituted aryl group of 6 to 20 carbon atoms. $R^{L07}$ to $R^{L16}$ independently represent hydrogen or monovalent hydrocarbon groups of 1 to 15 carbon atoms which may contain a hetero atom. Alternatively, $R^{L07}$ to $R^{L16}$, taken together, may form a ring. Each of $R^{L07}$ to $R^{L16}$ represents a divalent $C_1$-$C_{15}$ hydrocarbon group which may contain a hetero atom, when they form a ring. Two of $R^{L07}$ to $R^{L16}$ which are attached to adjoining carbon atoms may bond together directly to form a double bond. Letter y is an integer of 0 to 6. Letter m is equal to 0 or 1, n is equal to 0, 1, 2 or 3, and 2 m+n is equal to 2 or 3.

Examples of the respective groups are as previously described.

The dissolution regulator may be formulated in an amount of 0 to 50 parts, preferably 0 to 40 parts, and more preferably 0 to 30 parts, per 100 parts of the base resin, and may be used singly or as a mixture of two or more thereof. The use of more than 50 parts of the dissolution regulator would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Nitrogen-Containing Compound

In the resist composition, an organic nitrogen-containing compound or compounds may be compounded.

The organic nitrogen-containing compound used herein is preferably a compound capable of suppressing the rate of diffusion when the acid generated by the acid generator diffuses within the resist film. The inclusion of this type of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

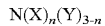
(B)-1

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring.

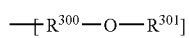
(X1)

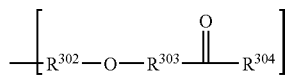
(X2)

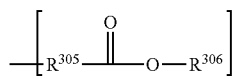
(X3)

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is hydrogen or a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (B)-2.

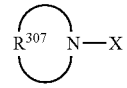
(B)-2

Herein X is as defined above, and $R^{307}$ is a straight or branched alkylene group of 2 to 20 carbon atoms which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy) ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more organic nitrogen-containing compounds having cyano group represented by the following general formulae (B)-3 to (B)-6 may be blended.

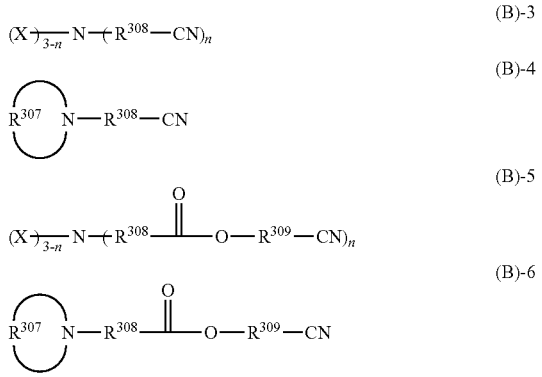

Herein, X, $R^{307}$ and n are as defined above, and $R^{308}$ and $R^{309}$ are each independently a straight or branched alkylene group of 1 to 4 carbon atoms.

Illustrative examples of the organic nitrogen-containing compounds having cyano represented by formulae (B)-3 to (B)-6 include 3-(diethylamino)propionitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiono-nitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole structure and a polar functional group, represented by the general formula (B)-7.

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

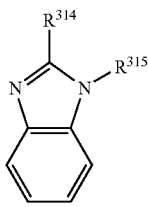

(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

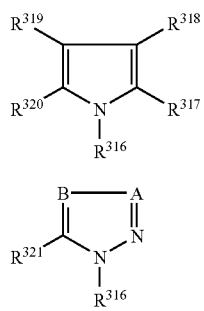

(B)-9

(B)-10

Herein, A is a nitrogen atom or $=C-R^{322}$, B is a nitrogen atom or $=C-R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{31}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the entire base resin. Less than 0.001 part of the nitrogen-containing compound achieves no or little addition effect whereas more than 2 parts would result in too low a sensitivity.

Other Components

In the resist composition, a compound having a carboxyl group may be blended. Exemplary, non-limiting compounds having a carboxyl group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below are replaced by —$R^{401}$—COOH (wherein $R^{401}$ is a straight or branched alkylene of 1 to 10 carbon atoms), and in which the molar ratio C/(C+D) of phenolic hydroxyl groups (C) to —O—$R^{401}$—COOH groups (D) in the molecule is from 0.1 to 1.0.

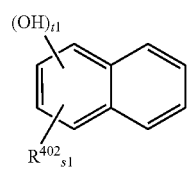

(A1)

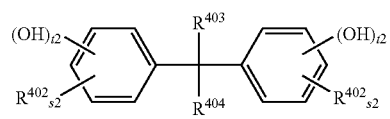

(A2)

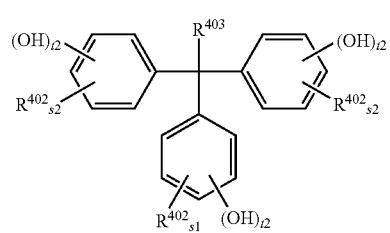

(A3)

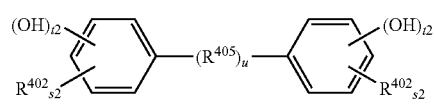

(A4)

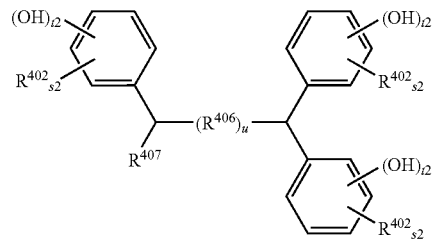

(A5)

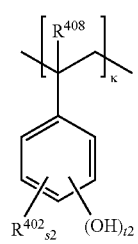

(A6)

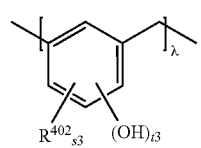

(A7)

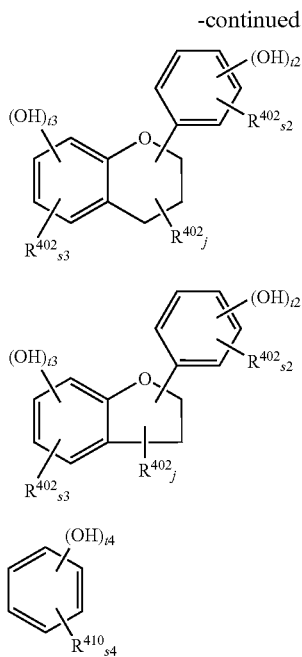

(A8)

(A9)

(A10)

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$—(wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; the letter j is an integer from 0 to 2; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas ($A_{11}$) to ($A_{15}$) below.

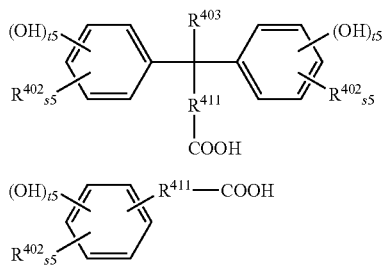

(A11)

(A12)

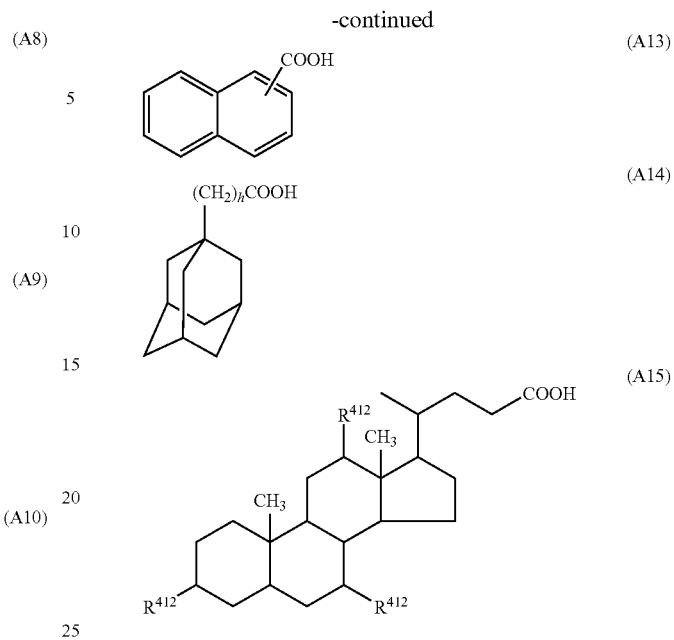

(A13)

(A14)

(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is 0 to 2.

Illustrative, non-limiting examples of the compound having a carboxyl group include compounds of the general formulas AI-1 to AI-14 and AII-1 to AII-10 below.

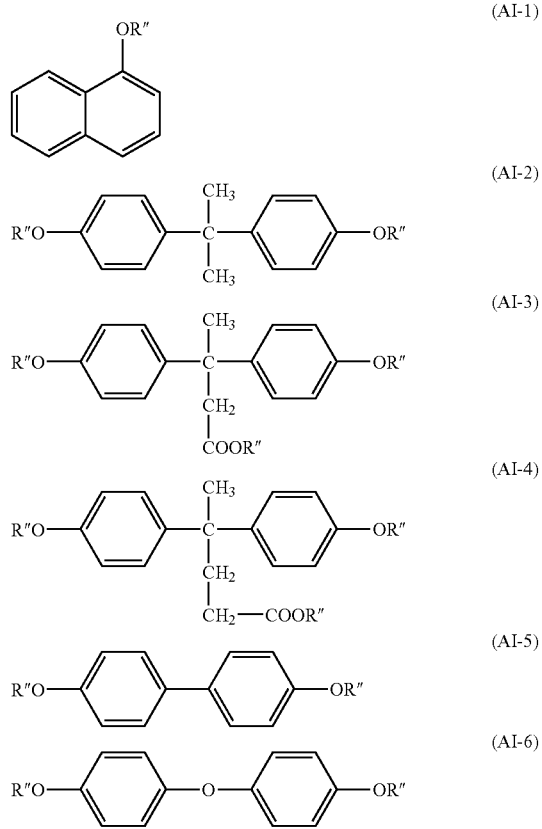

(AI-1)

(AI-2)

(AI-3)

(AI-4)

(AI-5)

(AI-6)

-continued
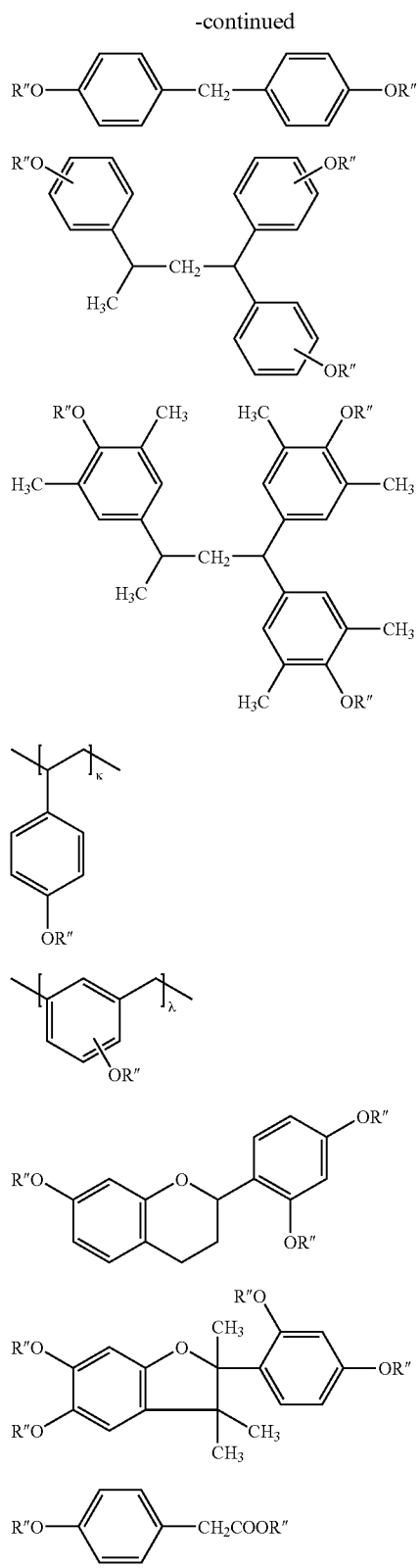
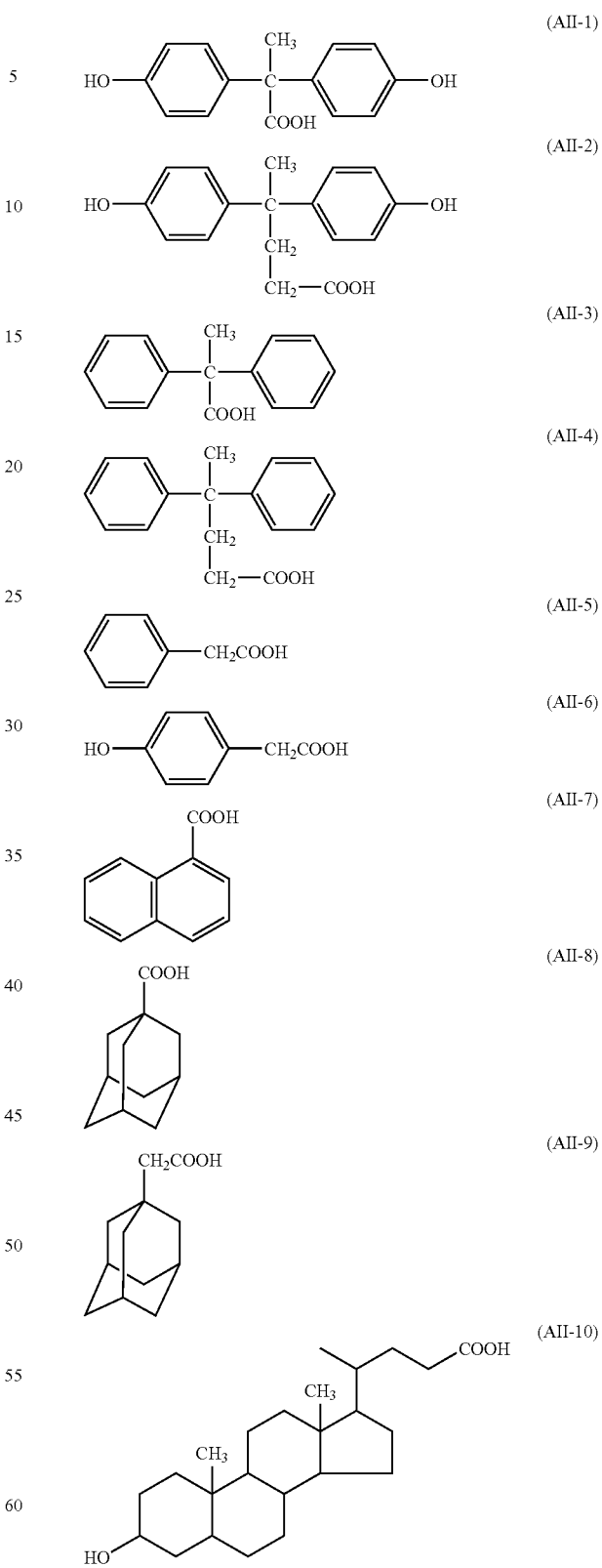
In the above formulas, R″ is hydrogen or a —CH$_2$COOH group such that the —CH$_2$COOH group accounts for 10 to 100 mol % of R″ in each compound, κ and λ are as defined above.
The compound having a carboxyl group may be used singly or as combinations of two or more thereof. The compound having a carboxyl group is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

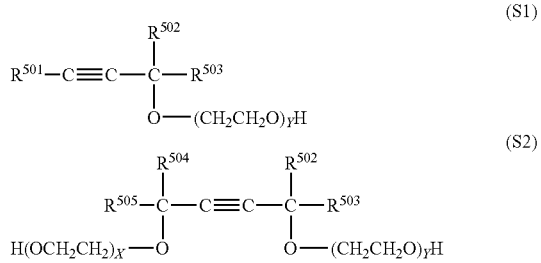

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.1 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm², and preferably about 5 to 100 mJ/cm². Light exposure may be done by a conventional exposure process or in some cases, by an immersion process of providing liquid impregnation between the mask and the resist. The resist film is then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5 wt % (preferably 2 to 3 wt %) aqueous solution of tetramethylammonium hydroxide (TMAH), this being done by a conventional method such as dip, puddle, or spray development for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 248 to 193 nm, an excimer laser, x-rays, or an electron beam. The desired pattern may not be obtainable outside the upper and lower limits of the above range.

EXAMPLE

Synthesis Examples and Examples are given below by way of illustration and not by way of limitation. The abbreviation Mw is a weight average molecular weight as measured by GPC using polystyrene standards, and SEM is scanning electron microscope.

Polymers within the scope of the invention were synthesized by the following procedure.

Synthesis Example 1

Synthesis of Polymer 1

In a flask, 187.5 g of propylene glycol monomethyl ether acetate (PGMEA) was fed and heated at 80° C. with stirring. To this, a mixture of 83.6 g of 3-ethyl-3-exo-tetracyclo[4.4.0.1²,⁵.1⁷,¹⁰]dodecanyl methacrylate, 45.9 g of 2-[2-(methacryloyloxy)ethoxycarbonyl]cyclohexane-carboxylic acid, 120.5 g of 9-methoxycarbonyl-4-oxatricyclo-[4.2.1.0³,⁷]nonan-5-on-2-yl methacrylate, 5.88 g of 2,2'-azobisisobutyronitrile, 0.70 g of 2-mercaptoethanol, and 562.5 g of PGMEA was added dropwise over 4 hours, followed by 2 hours of additional heating at 80° C. The reaction solution was cooled to room temperature, after which with vigorous stirring, it was added dropwise to 10 liters of hexane. The resulting solids were collected by filtration and dried in vacuum at 40° C. for 15 hours, obtaining a polymer (designated Polymer 1) in white powder solid form. The amount was 221.3 g and the yield was 88.5%. An integration ratio computed from a ¹H-NMR spectrum indicated an approximate copolymer compositional ratio of 30/20/50. Polymer 1 had a Mw of 6,600.

Synthesis Examples 2-47

Synthesis of Polymers 2-47

Polymers 2 to 47, identified below, were synthesized by the same procedure as above or a well-known procedure.

(Polymer 1)
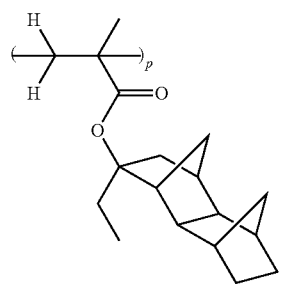 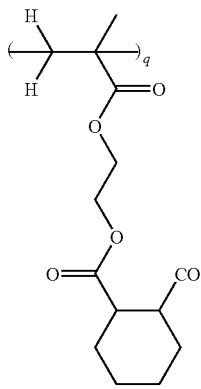
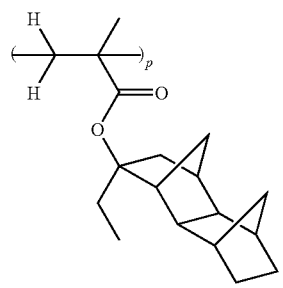
p = 0.50, q = 0.20,
s = 0.50, Mw = 6,600
(Polymer 2)
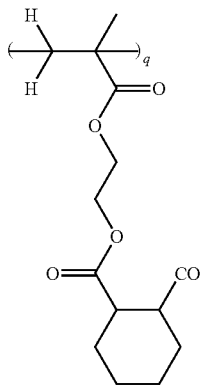
p = 0.50, q = 0.10,
s = 0.40, Mw = 5,900
-continued
(Polymer 3)
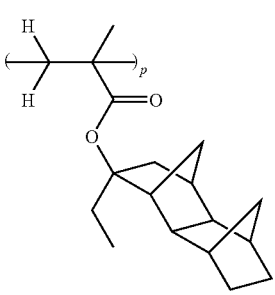 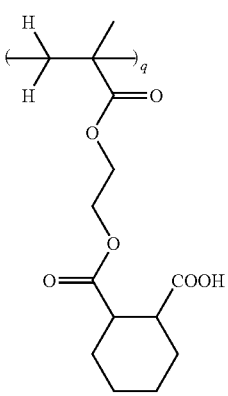
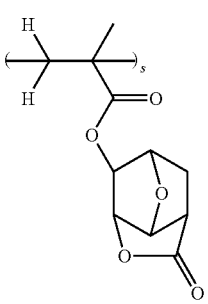
p = 0.30, q = 0.20,
s = 0.50, Mw = 6,600
(Polymer 4)
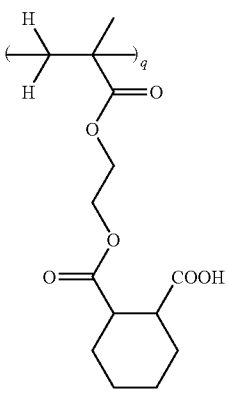
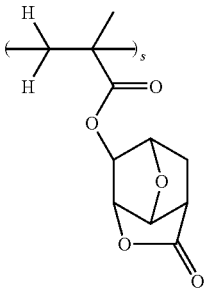
p = 0.50, q = 0.10,
s = 0.40, Mw = 6,000
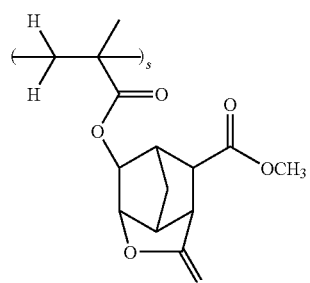

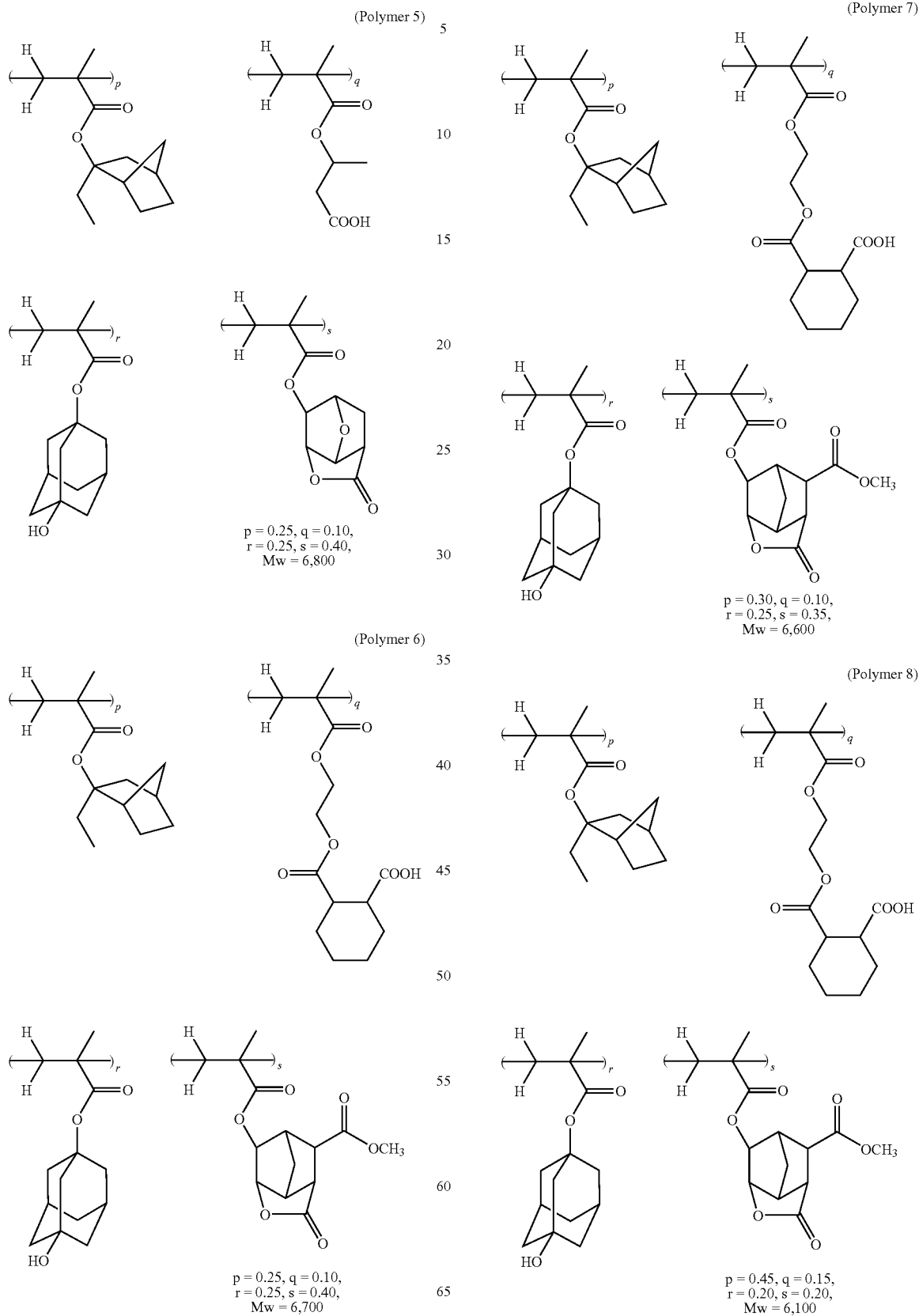

-continued
(Polymer 9)
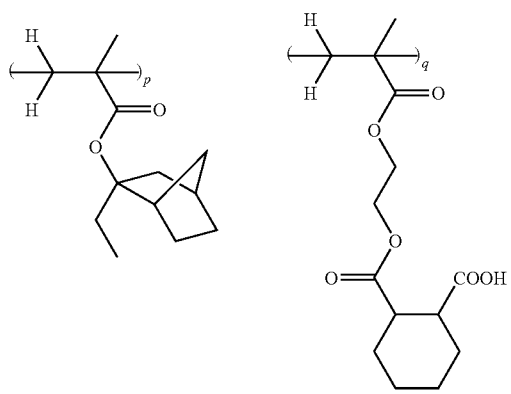
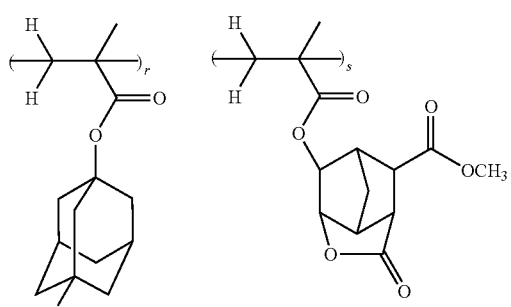
p = 0.50, q = 0.10,
r = 0.20, s = 0.20,
Mw = 6,000
(Polymer 10)
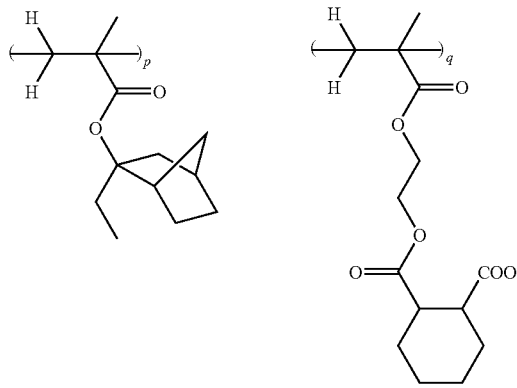
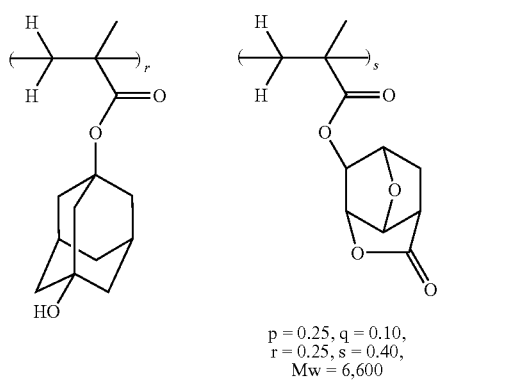
p = 0.25, q = 0.10,
r = 0.25, s = 0.40,
Mw = 6,600
-continued
(Polymer 11)
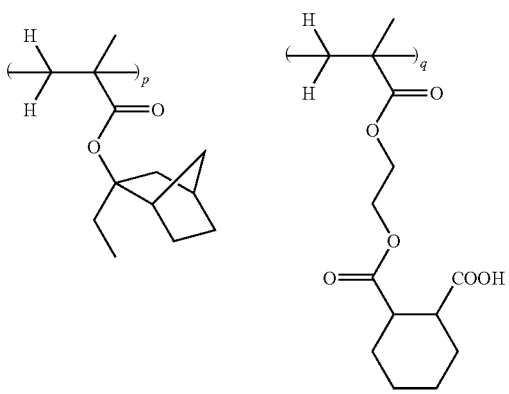
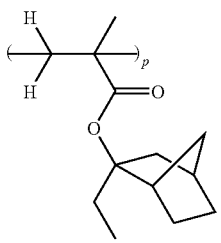
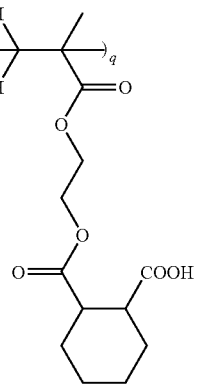
p = 0.30, q = 0.10,
r = 0.25, s = 0.35,
Mw = 6,600
(Polymer 12)
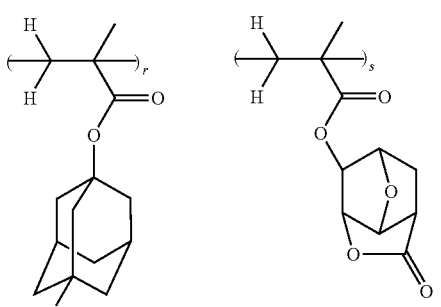
p = 0.45, q = 0.15,
r = 0.20, s = 0.20,
Mw = 6,000

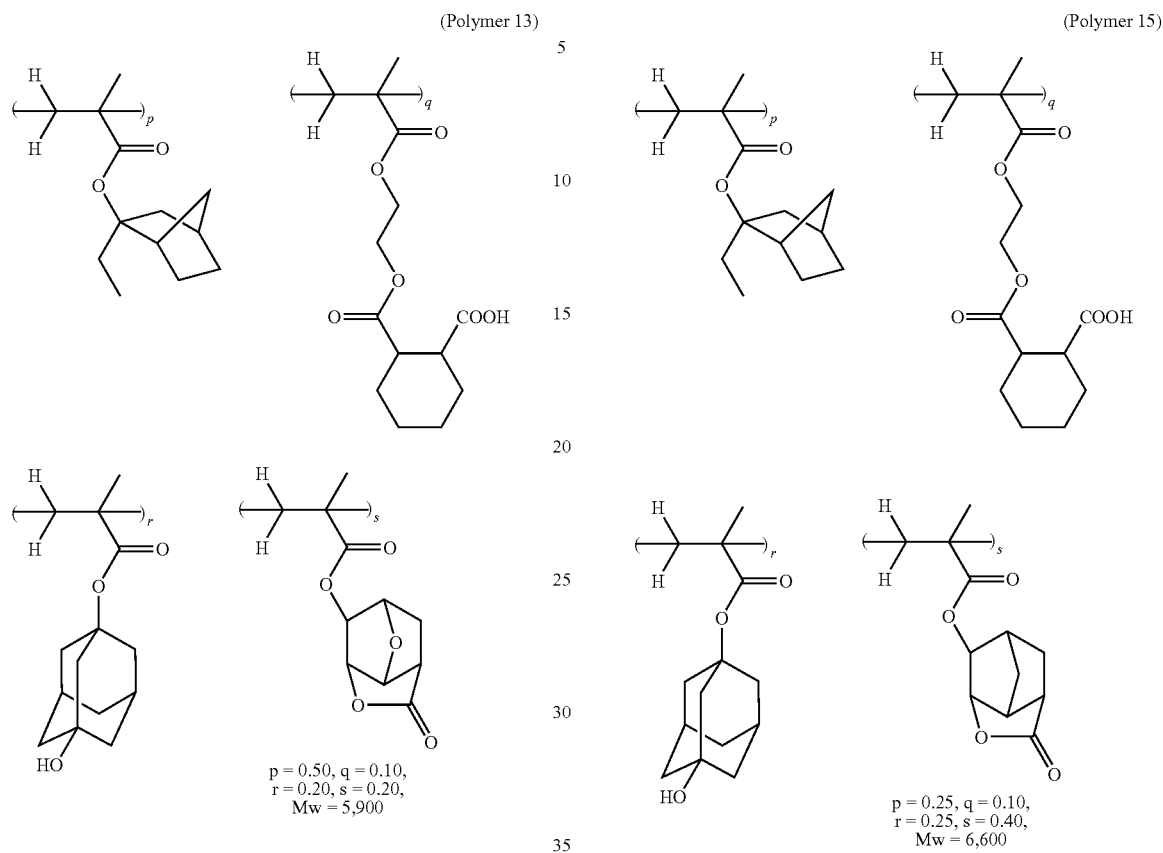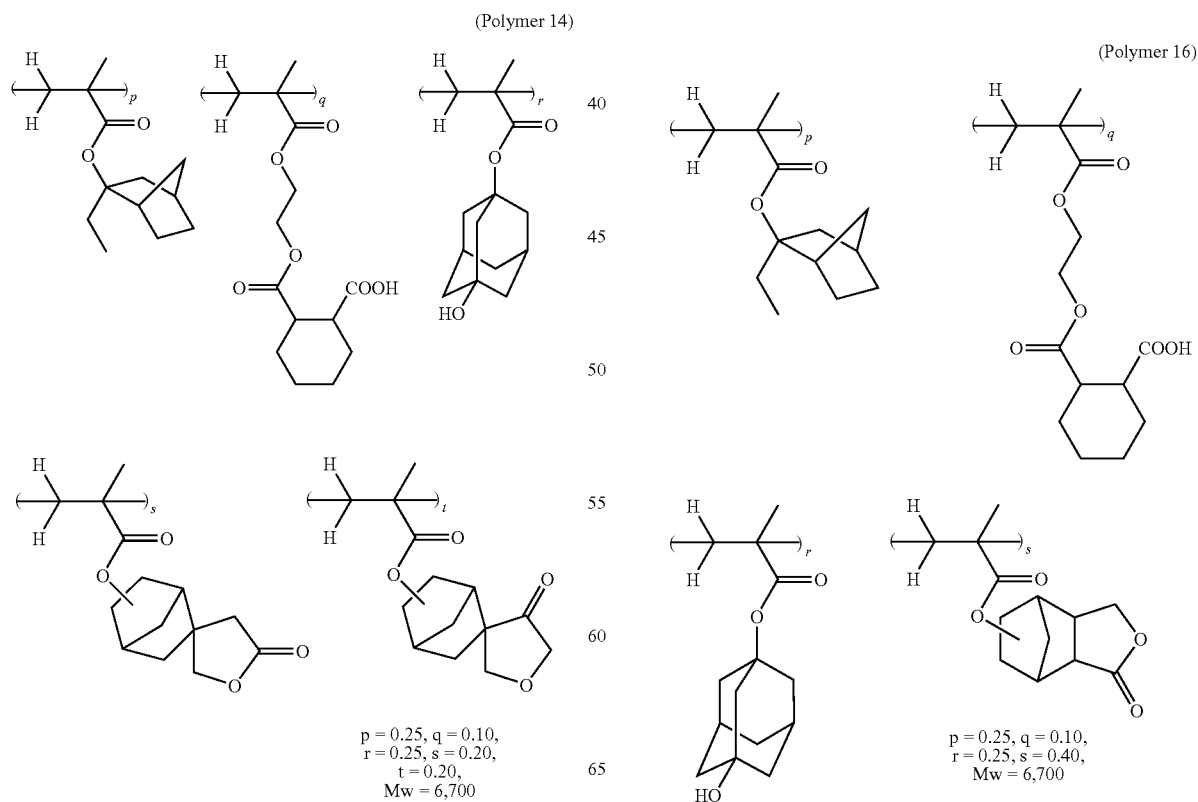

-continued
(Polymer 17)
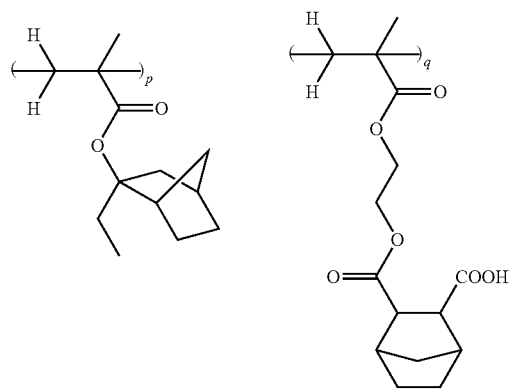
p = 0.25, q = 0.10,
r = 0.25, s = 0.40,
Mw = 6,500
(Polymer 18)
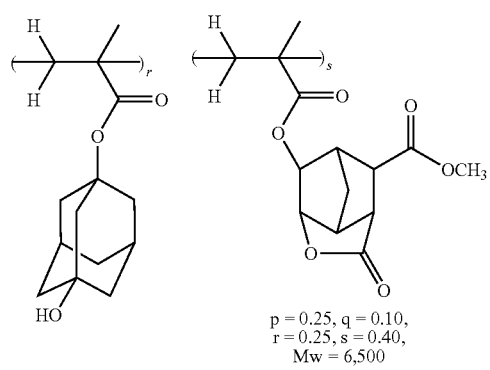
p = 0.25, q = 0.10,
r = 0.25, s = 0.40,
Mw = 6,600
-continued
(Polymer 19)
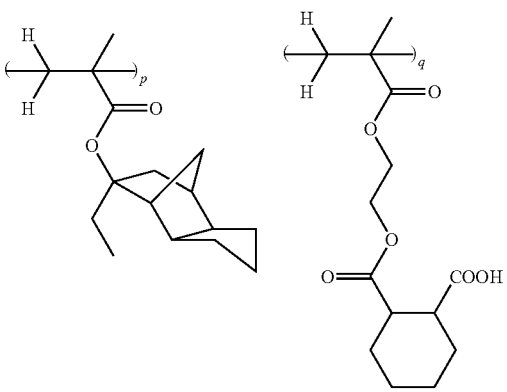
p = 0.25, q = 0.10,
r = 0.25, s = 0.40,
Mw = 6,700
(Polymer 20)
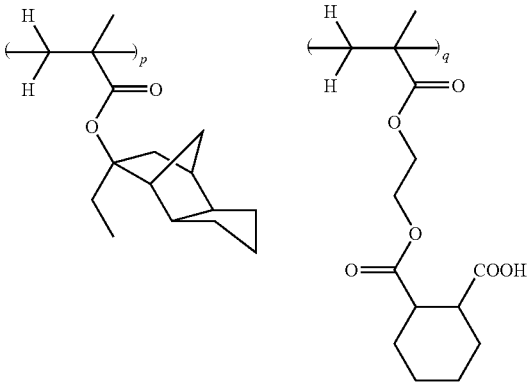
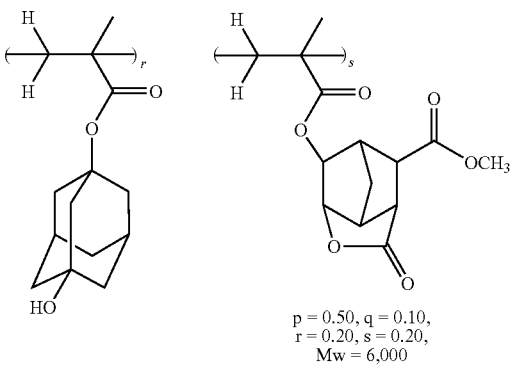
p = 0.50, q = 0.10,
r = 0.20, s = 0.20,
Mw = 6,000

-continued
(Polymer 21)
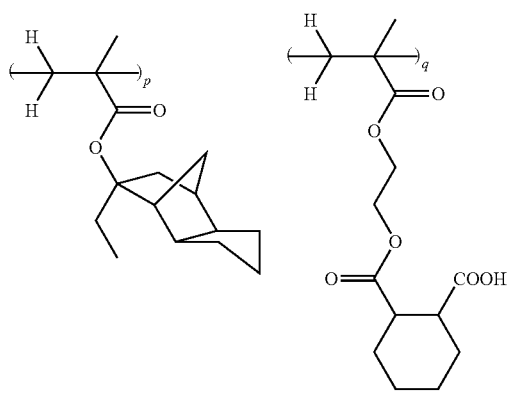
p = 0.25, q = 0.10,
r = 0.25, s = 0.40,
Mw = 6,600
(Polymer 22)
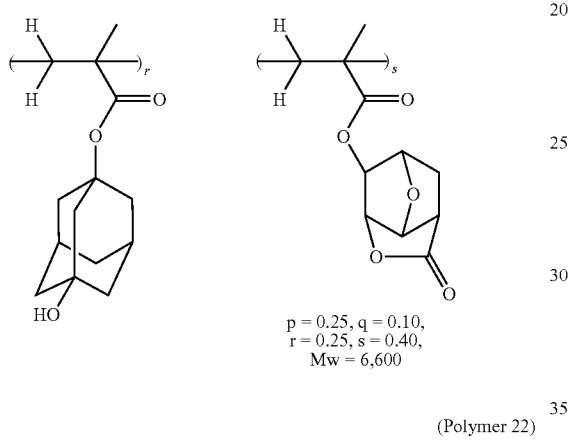
p = 0.50, q = 0.10,
r = 0.20, s = 0.20,
Mw = 5,900
-continued
(Polymer 23)
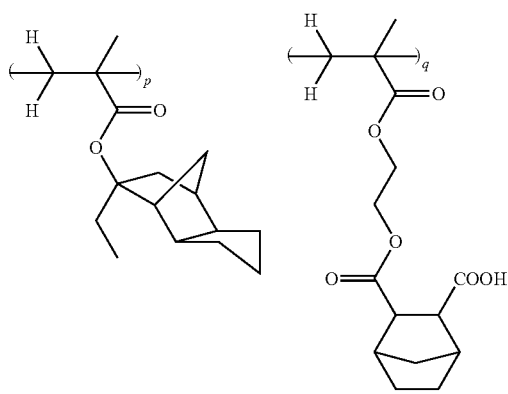
p = 0.25, q = 0.10,
r = 0.25, s = 0.40,
Mw = 6,700
(Polymer 24)
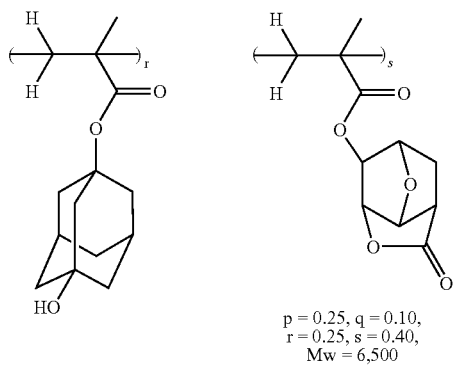
p = 0.25, q = 0.10,
r = 0.25, s = 0.40,
Mw = 6,500

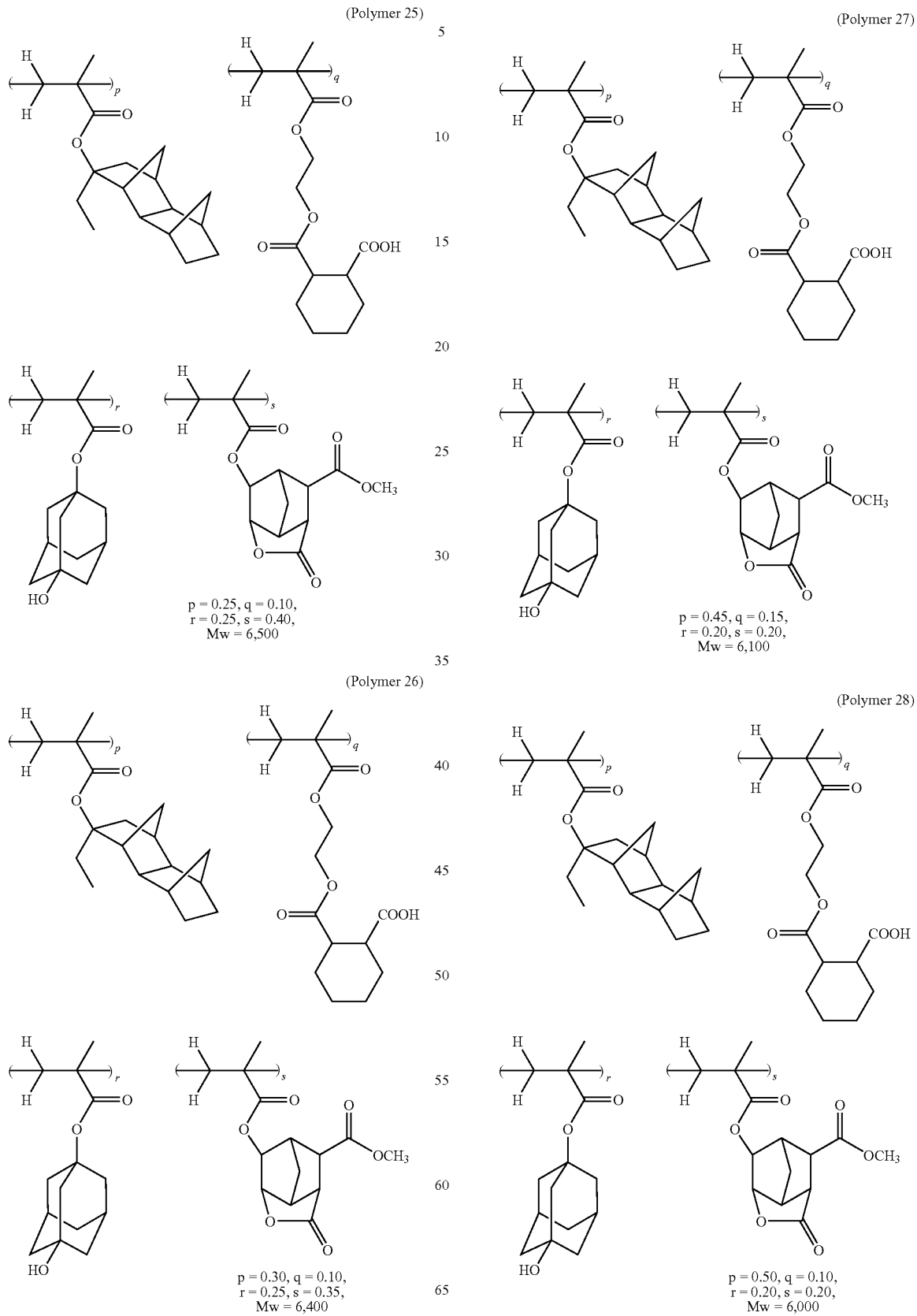

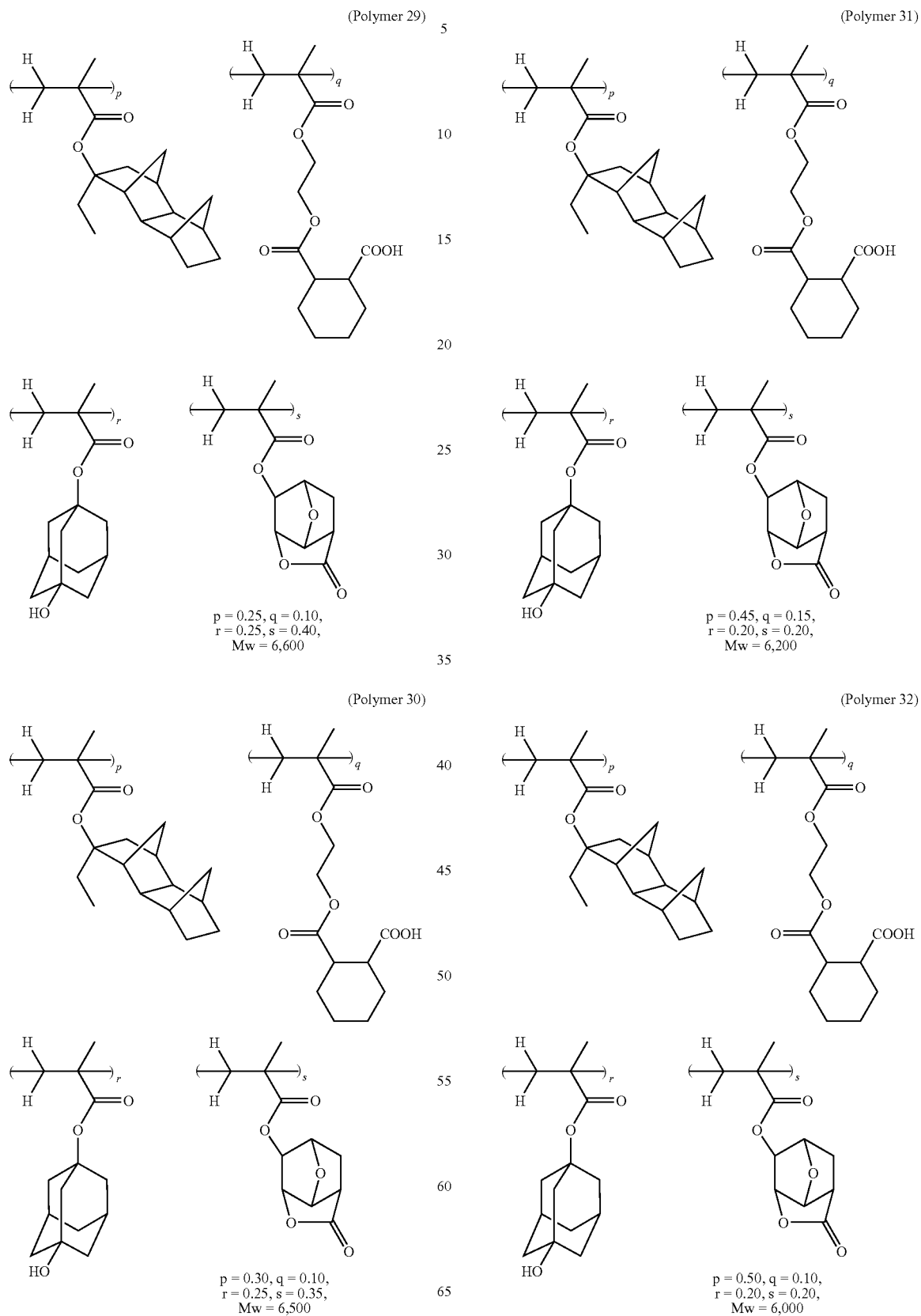

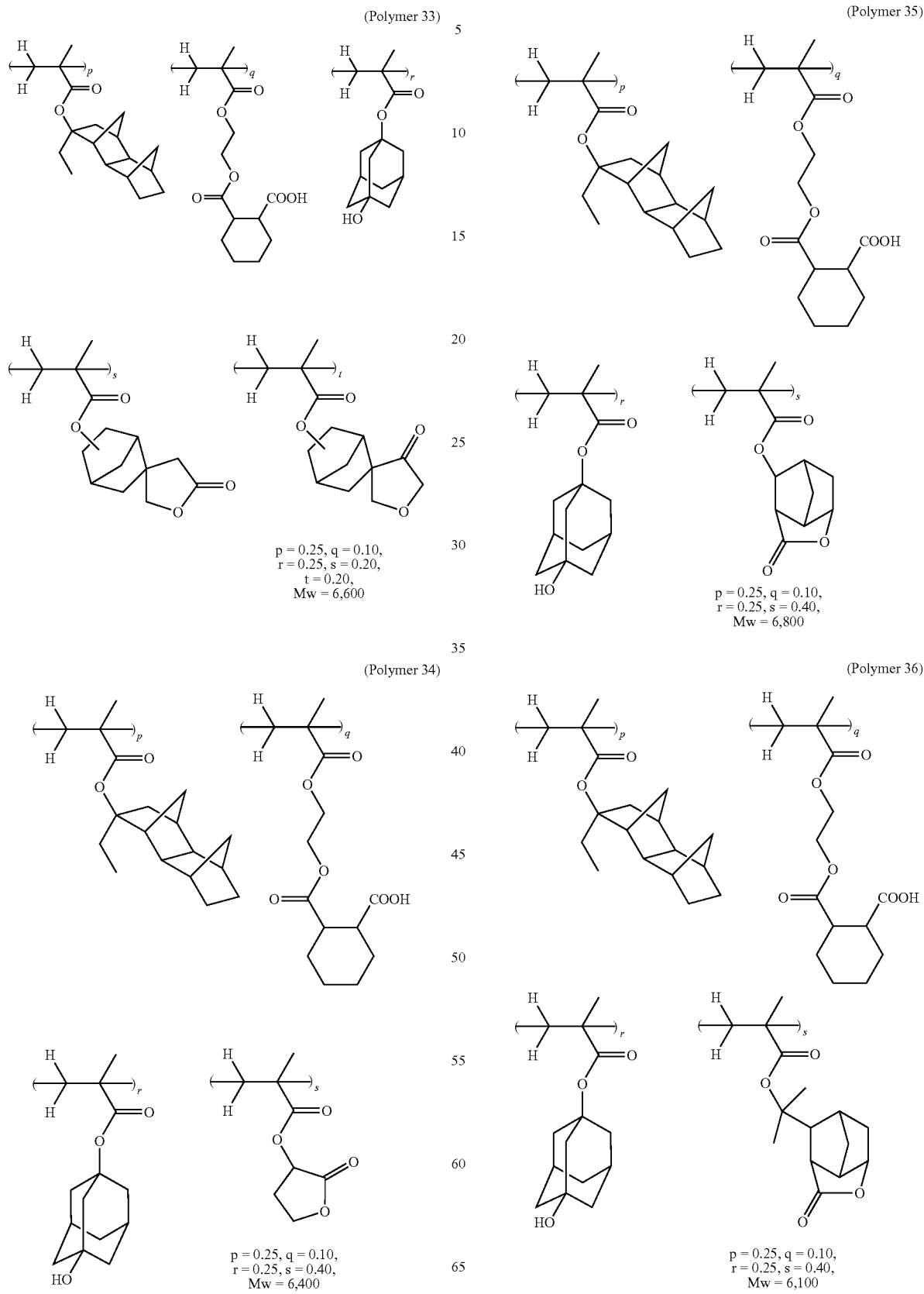

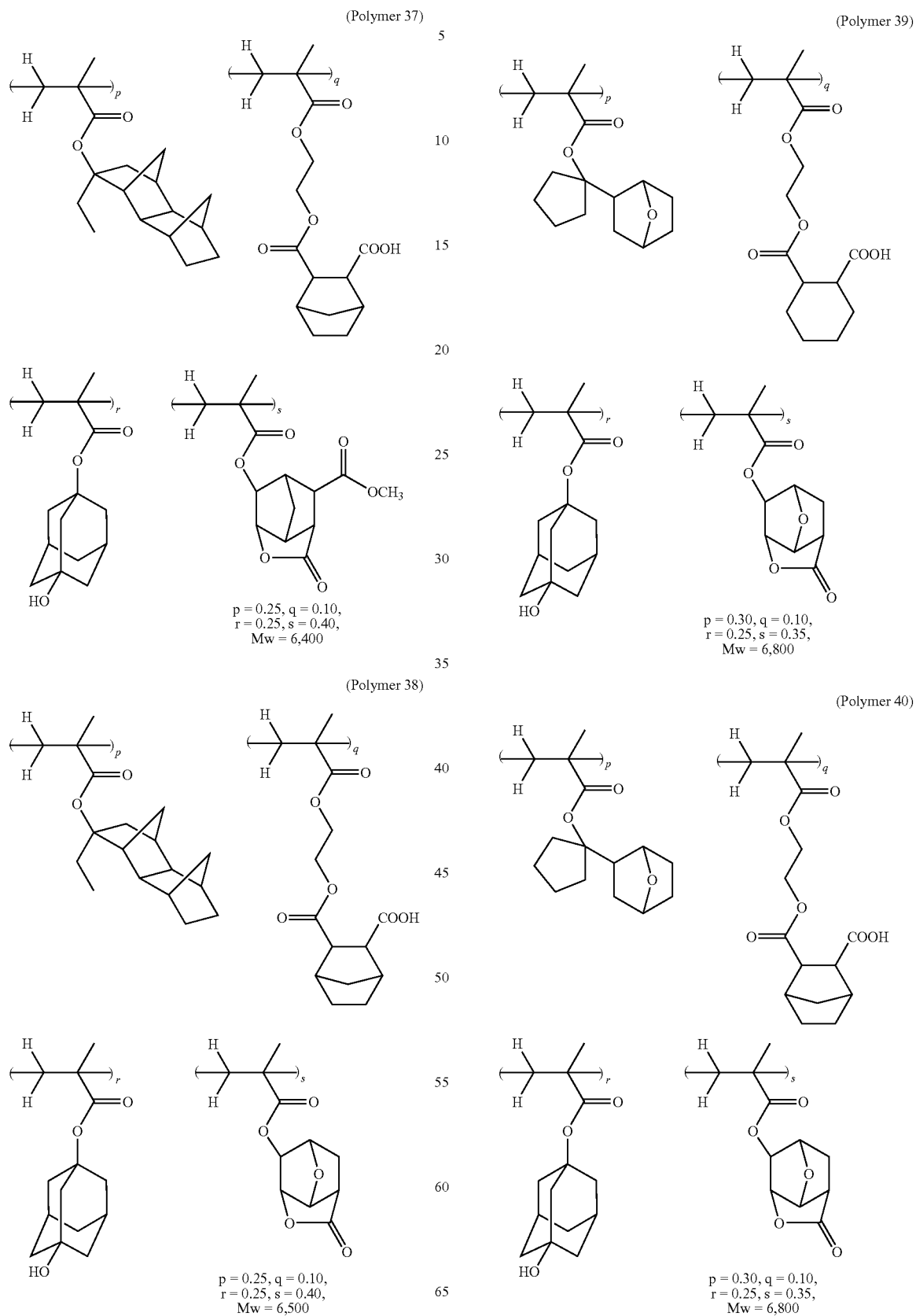

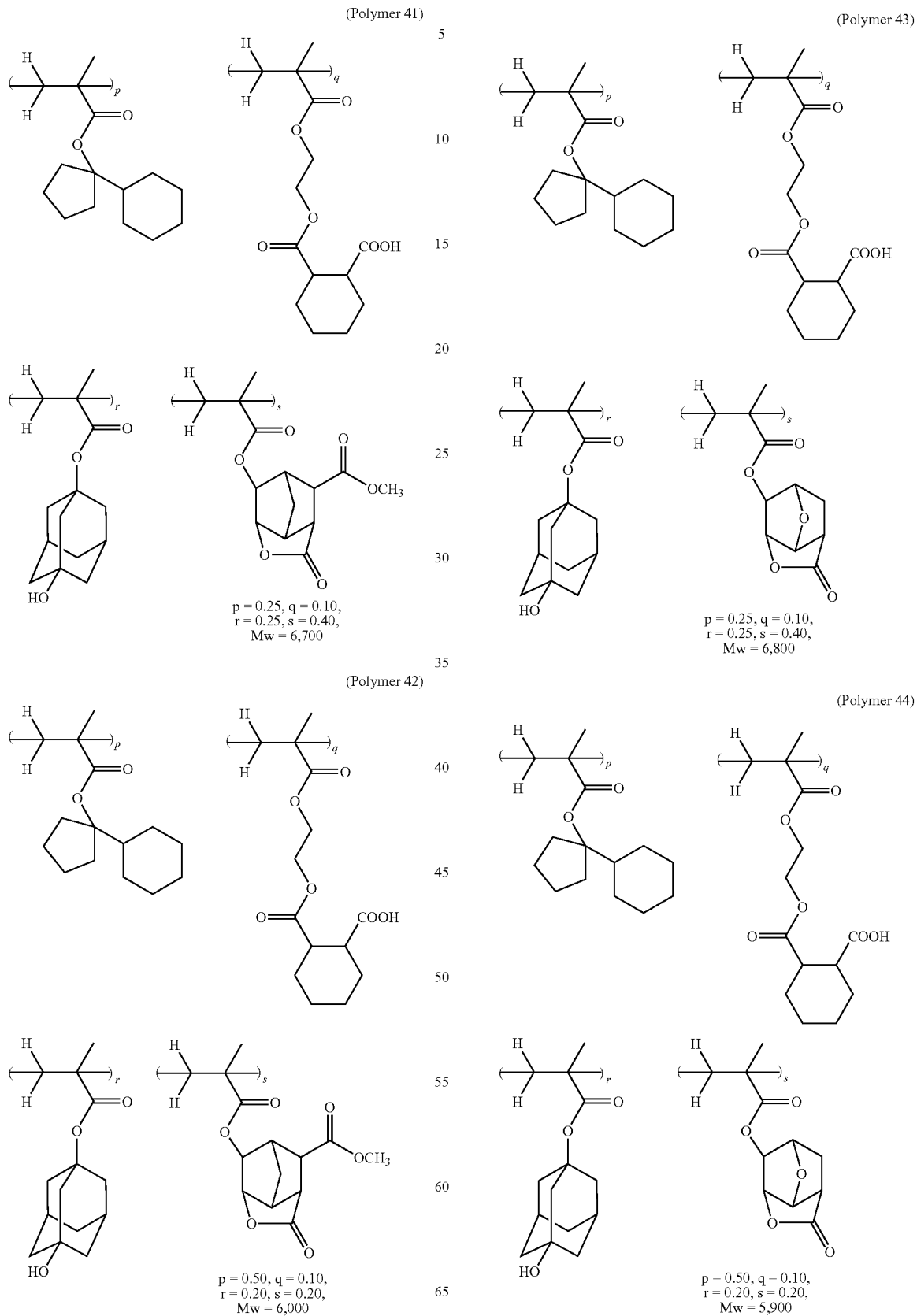

-continued (Polymer 45)

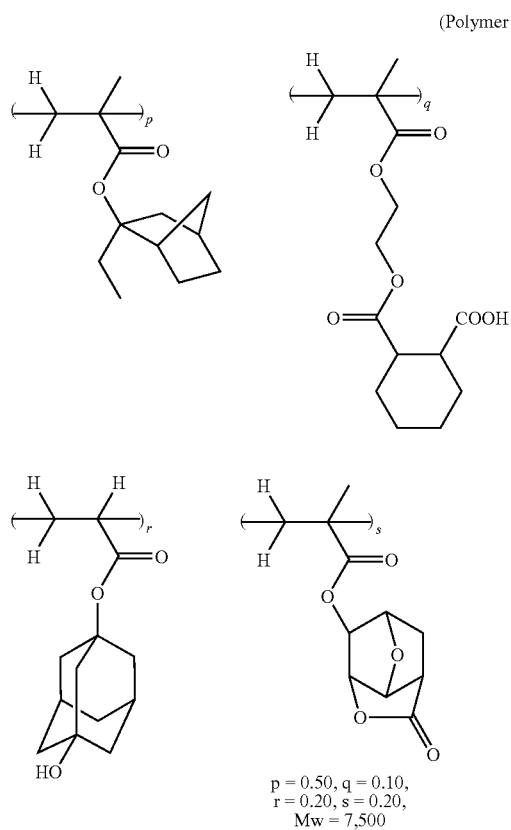

(Polymer 46)

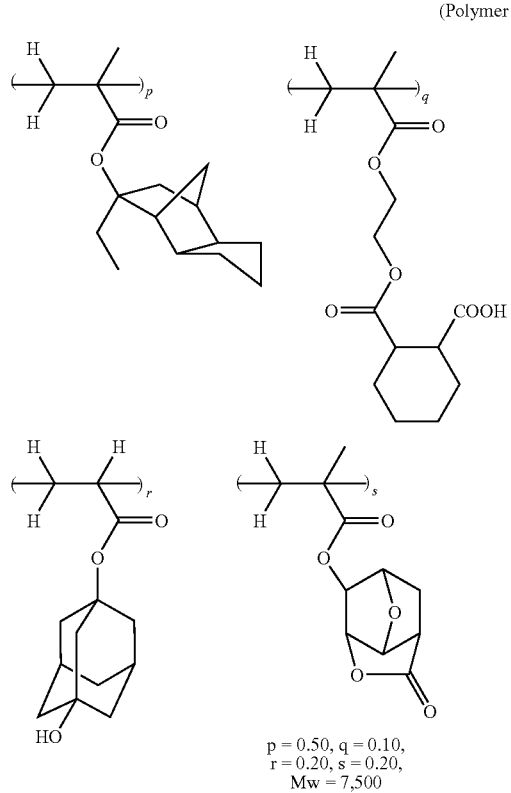

-continued (Polymer 47)

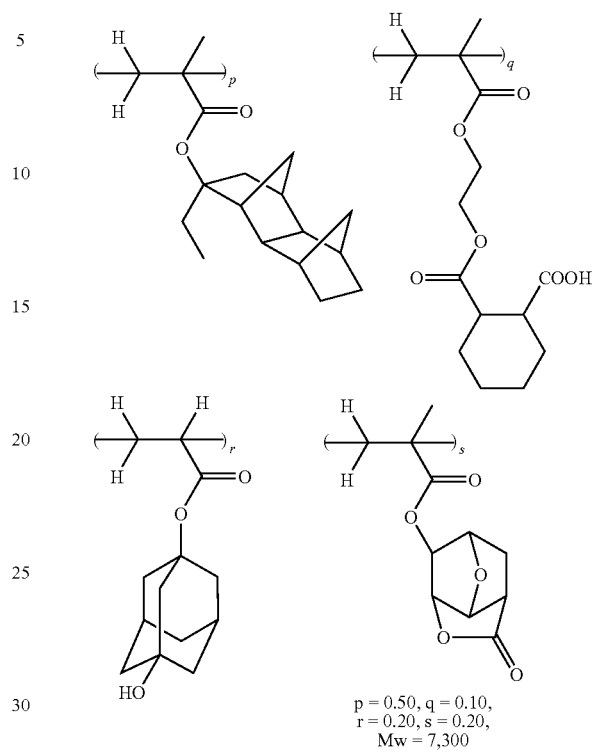

EXAMPLES

Resist compositions were formulated using inventive polymers and examined for resolution.

Examples 1-31 & Comparative Examples 1-5

Resist compositions were prepared by using inventive Polymers 1 to 47 or comparative Polymers 48 to 52, identified below, as the base resin, and dissolving the polymer, a photoacid generator, and a basic compound in a solvent in accordance with the recipe shown in Table 1. These compositions were each filtered through a Teflon® filter having a pore diameter 0.2 μm, thereby giving resist solutions.

(Polymer 48)

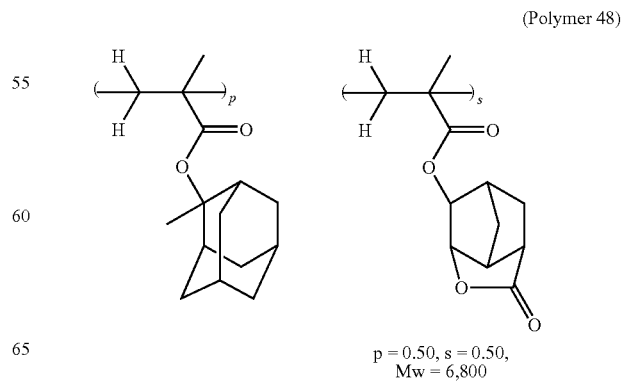

-continued

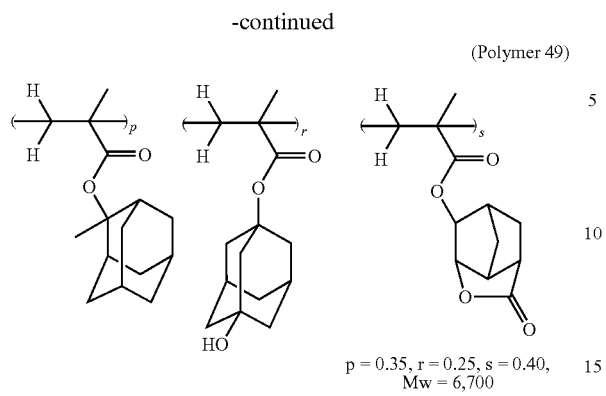

(Polymer 49)

p = 0.35, r = 0.25, s = 0.40,
Mw = 6,700

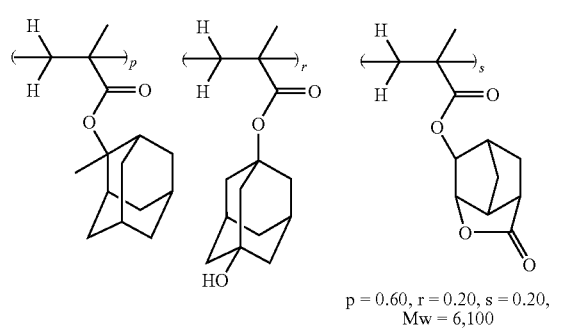

(Polymer 50)

p = 0.60, r = 0.20, s = 0.20,
Mw = 6,100

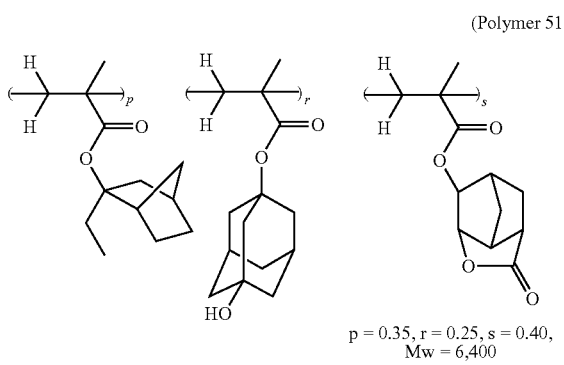

(Polymer 51)

p = 0.35, r = 0.25, s = 0.40,
Mw = 6,400

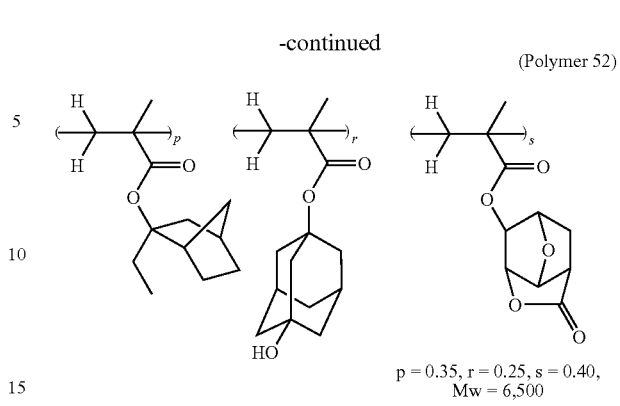

(Polymer 52)

p = 0.35, r = 0.25, s = 0.40,
Mw = 6,500

These resist solutions were spin coated onto silicon wafers having an antireflective film (ARC29A by Nissan Chemical Co., Ltd., 78 nm thick) coated thereon, then heat treated at 130° C. for 60 seconds to form resist films having a thickness of 300 nm. The resist films were exposed using an ArF excimer laser stepper (Nikon Corporation; NA 0.68), then heat treated at 105° C. to 130° C. for 60 seconds, and puddle developed with a solution of 2.38 wt % tetramethylammonium hydroxide in water for 60 seconds, thereby giving 1:1 line-and-space patterns.

The wafers as developed were sectioned and observed under sectional SEM. The optimal exposure (Eop, mJ/cm$^2$) was defined as the exposure dose which provided a 1:1 resolution at the top and bottom of a 0.13 μm line-and-space pattern. The resolution of the resist under evaluation was defined as the minimum line width (μm) of the lines and spaces that separated at the optimal exposure. The profile of the resist pattern was examined under a SEM. It was also observed whether or not the pattern was stripped, with the results being rated as acceptable (◯) or rejected (X) as the evaluation of substrate adhesion. Development defects were evaluated by using a wafer having a 0.14 μm line-and-space pattern formed thereon, and counting the number of defects by means of a wafer inspection system WIN-WIN50 Model 1200L (Accretech Microtechnology Co., Ltd.).

The composition and test results of the resist of each example are reported in Table 1. The composition and test results of the resist of each comparative example are reported in Table 2. The acid generator, basic compound and solvent shown in Tables 1 and 2 are identified below. It is noted that the solvent contained 0.01% by weight of surfactant KH-20 (Asahi Glass Co., Ltd.).

TPSNF: triphenylsulfonium nonafluorobutanesulfonate
TMMEA: trismethoxymethoxyethylamine
PGMEA: propylene glycol monomethyl ether acetate

TABLE 1

| Example | Resin (pbw) | Photoacid generator (pbw) | Basic compound (pbw) | Solvent (pbw) | PEB temp., ° C. | Eop, mJ/cm$^2$ | Resolution, μm | Profile | Substrate adhesion | Development defects |
|---|---|---|---|---|---|---|---|---|---|---|
| 1 | polymer 1 (80) | TPSNF (2.18) | TMMEA (0.472) | PGMEA (640) | 110 | 26 | 0.13 | rectangular | ◯ | <10 |
| 2 | polymer 2 (80) | TPSNF (2.18) | TMMEA (0.472) | PGMEA (640) | 105 | 23 | 0.13 | rectangular | ◯ | 10~20 |
| 3 | polymer 6 (80) | TPSNF (2.18) | TMMEA (0.472) | PGMEA (640) | 115 | 25 | 0.12 | rectangular | ◯ | <10 |
| 4 | polymer 9 (80) | TPSNF (2.18) | TMMEA (0.472) | PGMEA (640) | 110 | 24 | 0.11 | rectangular | ◯ | <10 |

TABLE 1-continued

| Example | Resin (pbw) | Photoacid generator (pbw) | Basic compound (pbw) | Solvent (pbw) | PEB temp., °C. | Eop, mJ/cm$^2$ | Resolution, μm | Profile | Substrate adhesion | Development defects |
|---|---|---|---|---|---|---|---|---|---|---|
| 5 | polymer 10 (80) | TPSNF (2.18) | TMMEA (0.472) | PGMEA (640) | 115 | 25 | 0.12 | rectangular | ○ | <10 |
| 6 | polymer 12 (80) | TPSNF (2.18) | TMMEA (0.472) | PGMEA (640) | 110 | 25 | 0.11 | rectangular | ○ | <10 |
| 7 | polymer 13 (80) | TPSNF (2.18) | TMMEA (0.472) | PGMEA (640) | 110 | 24 | 0.11 | rectangular | ○ | <10 |
| 8 | polymer 15 (80) | TPSNF (2.18) | TMMEA (0.472) | PGMEA (640) | 115 | 26 | 0.12 | rectangular | ○ | 20~50 |
| 9 | polymer 16 (80) | TPSNF (2.18) | TMMEA (0.472) | PGMEA (640) | 115 | 27 | 0.12 | rectangular | ○ | 20~50 |
| 10 | polymer 19 (80) | TPSNF (2.18) | TMMEA (0.472) | PGMEA (640) | 115 | 24 | 0.12 | rectangular | ○ | <10 |
| 11 | polymer 20 (80) | TPSNF (2.18) | TMMEA (0.472) | PGMEA (640) | 110 | 22 | 0.11 | rectangular | ○ | <10 |
| 12 | polymer 21 (80) | TPSNF (2.18) | TMMEA (0.472) | PGMEA (640) | 115 | 25 | 0.12 | rectangular | ○ | <10 |
| 13 | polymer 22 (80) | TPSNF (2.18) | TMMEA (0.472) | PGMEA (640) | 110 | 23 | 0.11 | rectangular | ○ | <10 |
| 14 | polymer 24 (80) | TPSNF (2.18) | TMMEA (0.472) | PGMEA (640) | 115 | 25 | 0.12 | rectangular | ○ | <10 |
| 15 | polymer 25 (80) | TPSNF (2.18) | TMMEA (0.472) | PGMEA (640) | 115 | 24 | 0.12 | rectangular | ○ | <10 |
| 16 | polymer 26 (80) | TPSNF (2.18) | TMMEA (0.472) | PGMEA (640) | 115 | 23 | 0.11 | rectangular | ○ | <10 |
| 17 | polymer 27 (80) | TPSNF (2.18) | TMMEA (0.472) | PGMEA (640) | 110 | 25 | 0.11 | rectangular | ○ | <10 |
| 18 | polymer 28 (80) | TPSNF (2.18) | TMMEA (0.472) | PGMEA (640) | 110 | 24 | 0.11 | rectangular | ○ | <10 |
| 19 | polymer 29 (80) | TPSNF (2.18) | TMMEA (0.472) | PGMEA (640) | 115 | 25 | 0.12 | rectangular | ○ | <10 |
| 20 | polymer 30 (80) | TPSNF (2.18) | TMMEA (0.472) | PGMEA (640) | 115 | 23 | 0.11 | rectangular | ○ | <10 |
| 21 | polymer 31 (80) | TPSNF (2.18) | TMMEA (0.472) | PGMEA (640) | 110 | 24 | 0.11 | rectangular | ○ | <10 |
| 22 | polymer 32 (80) | TPSNF (2.18) | TMMEA (0.472) | PGMEA (640) | 110 | 23 | 0.11 | rectangular | ○ | <10 |
| 23 | polymer 33 (80) | TPSNF (2.18) | TMMEA (0.472) | PGMEA (640) | 115 | 28 | 0.12 | rectangular | ○ | 10~20 |
| 24 | polymer 34 (80) | TPSNF (2.18) | TMMEA (0.472) | PGMEA (640) | 115 | 23 | 0.12 | rectangular | ○ | <10 |
| 25 | polymer 36 (80) | TPSNF (2.18) | TMMEA (0.472) | PGMEA (640) | 115 | 26 | 0.12 | rectangular | ○ | 10~20 |
| 26 | polymer 38 (80) | TPSNF (2.18) | TMMEA (0.472) | PGMEA (640) | 115 | 25 | 0.12 | rectangular | ○ | <10 |
| 27 | polymer 41 (80) | TPSNF (2.18) | TMMEA (0.472) | PGMEA (640) | 115 | 24 | 0.12 | rectangular | ○ | <10 |
| 28 | polymer 43 (80) | TPSNF (2.18) | TMMEA (0.472) | PGMEA (640) | 115 | 24 | 0.12 | rectangular | ○ | <10 |
| 29 | polymer 45 (80) | TPSNF (2.18) | TMMEA (0.472) | PGMEA (640) | 110 | 24 | 0.11 | rectangular | ○ | <10 |
| 30 | polymer 46 (80) | TPSNF (2.18) | TMMEA (0.472) | PGMEA (640) | 110 | 25 | 0.11 | rectangular | ○ | <10 |
| 31 | polymer 47 (80) | TPSNF (2.18) | TMMEA (0.472) | PGMEA (640) | 110 | 24 | 0.11 | rectangular | ○ | <10 |

TABLE 2

| Comparative Example | Resin (pbw) | Photoacid generator (pbw) | Basic compound (pbw) | Solvent (pbw) | PEB temp., °C. | Eop, mJ/cm$^2$ | Resolution, μm | Profile | Substrate adhesion | Development defects |
|---|---|---|---|---|---|---|---|---|---|---|
| 1 | polymer 48 (80) | TPSNF (2.18) | TMMEA (0.472) | PGMEA (640) | 125 | 27 | 0.13 | rectangular | ○ | 200~500 |
| 2 | polymer 49 (80) | TPSNF (2.18) | TMMEA (0.472) | PGMEA (640) | 130 | 30 | 0.13 | T-top | ○ | 500~1000 |
| 3 | polymer 50 (80) | TPSNF (2.18) | TMMEA (0.472) | PGMEA (640) | 125 | 22 | — | — | X peeled | 200~500 |
| 4 | polymer 51 (80) | TPSNF (2.18) | TMMEA (0.472) | PGMEA (640) | 115 | 23 | 0.12 | rectangular | ○ | 100~200 |
| 5 | polymer 52 (80) | TPSNF (2.18) | TMMEA (0.472) | PGMEA (640) | 115 | 22 | 0.12 | rectangular | ○ | 50~100 |

It is seen from Tables 1 and 2 that the resist compositions within the scope of the invention are improved in sensitivity, resolution, and substrate adhesion and minimized in development defects upon ArF excimer laser exposure.

Japanese Patent Application No. 2004-182741 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer consisting of recurring units having the general formulae (1), (2), (4) and (5), the recurring units being of at least one type for each formula, and having a weight average molecular weight of 1,000 to 50,000,

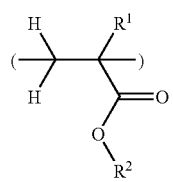
(1)

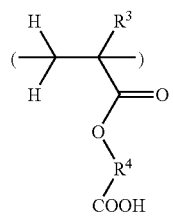
(2)

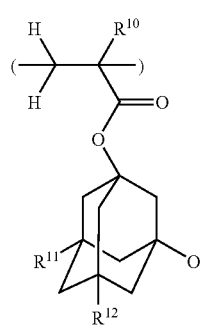
(4)

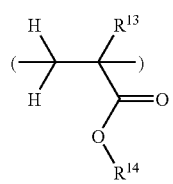
(5)

wherein $R^1$, $R^{10}$ and $R^{13}$ are independently hydrogen or methyl, $R^2$ is an acid labile group selected from the general formulae ($R^2$-1) to ($R^2$-7):

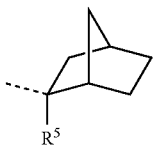
($R^2$-1)

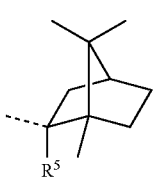
($R^2$-2)

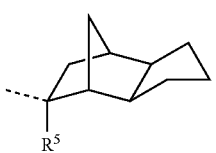
($R^2$-3)

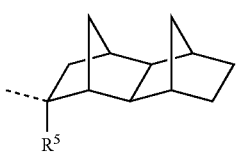
($R^2$-4)

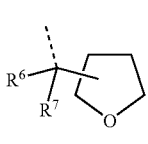
($R^2$-5)

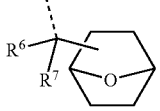
($R^2$-6)

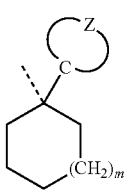
($R^2$-7)

wherein the broken line indicates a bonding site and direction, $R^5$ is each independently a straight, branched or cyclic alkyl group of 1 to 10 carbon atoms, $R^6$ and $R^7$ are each independently a straight, branched or cyclic alkyl group of 1 to 10 carbon atoms, or $R^6$ and $R^7$, taken together, may form a ring with the carbon atom to which they are attached, Z is a divalent hydrocarbon group of 2 to 20 carbon atoms which forms a single ring or bridged ring with the carbon atom to which it is attached and which may contain an oxygen atom, and m is 0 or 1, $R^{11}$ and $R^{12}$ are independently hydrogen or hydroxyl, and $R^{14}$ is a lactone structure-containing group selected from the general formulae ($R^{14}$-1) to ($R^{14}$-5):

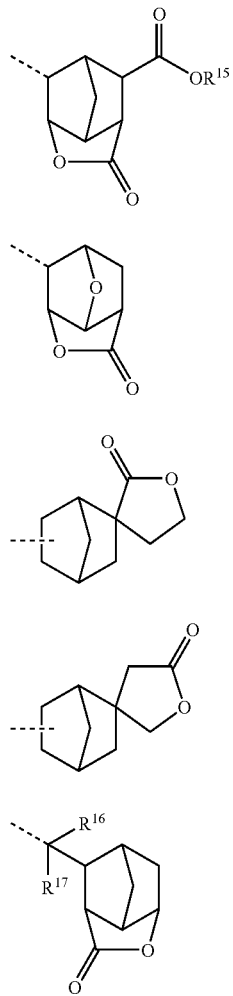

(R$^{14}$-1)
(R$^{14}$-2)
(R$^{14}$-3)
(R$^{14}$-4)
(R$^{14}$-5)

wherein the broken line indicates a bonding site, R$^{15}$ is a straight, branched or cyclic alkyl group of 1 to 10 carbon atoms, R$^{16}$ and R$^{17}$ are each independently hydrogen or a straight, branched or cyclic alkyl group of 1 to 10 carbon atoms, or R$^{16}$ and R$^{17}$, taken together, may form a ring with the carbon atom to which they are attached, and the recurring unit having the general formula (2) is selected from the group consisting of the units represented by the following formulae:

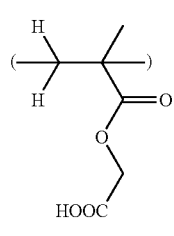
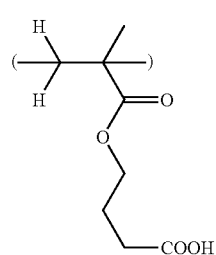

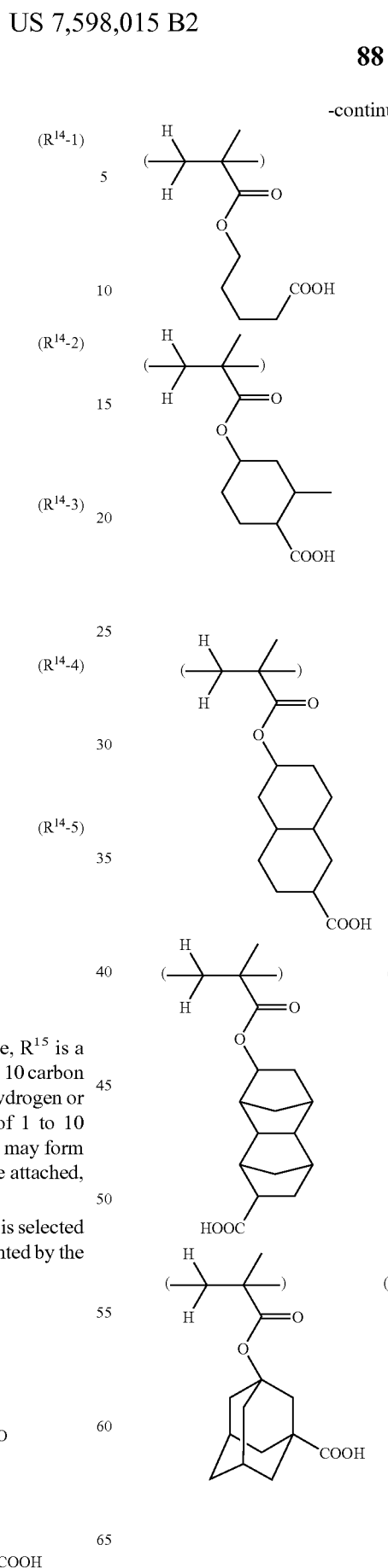

-continued
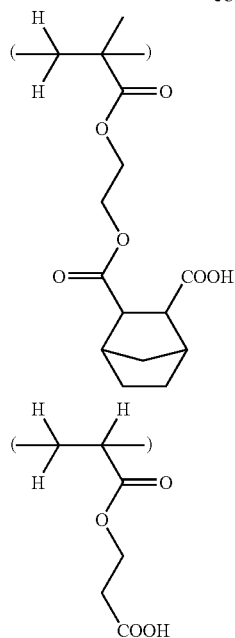
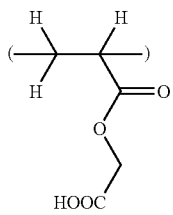
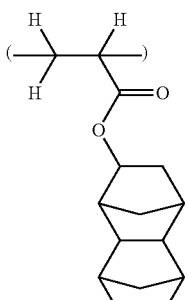
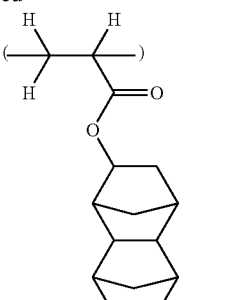
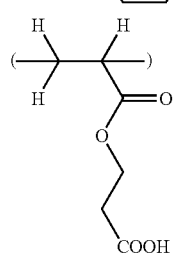
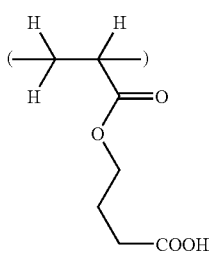
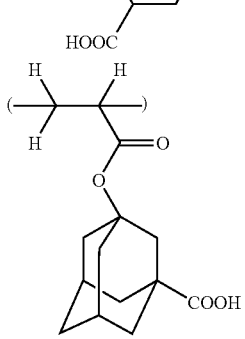
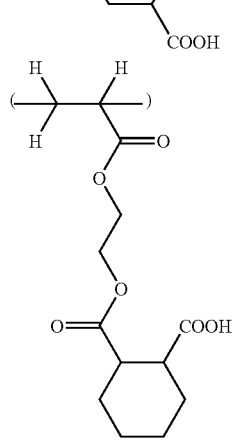
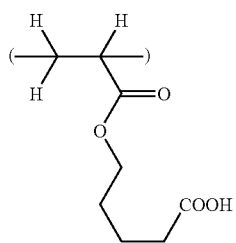
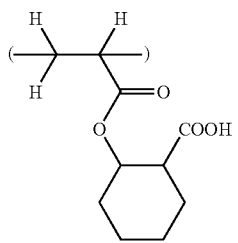
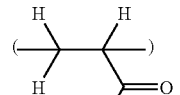
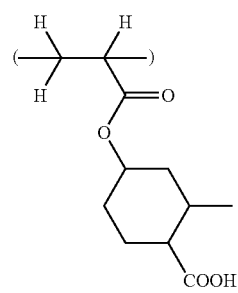
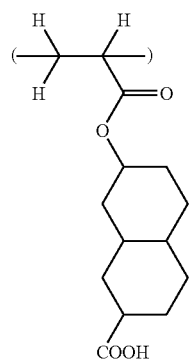
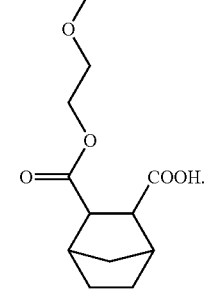
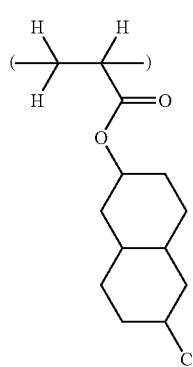
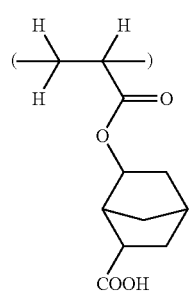
2. The polymer of claim 1, wherein the recurring units of each formula have a molar fraction of at least 3%.
3. The polymer of claim 1, wherein the recurring unit having the general formula (4) is selected from the group consisting of the units represented by the following formulae:
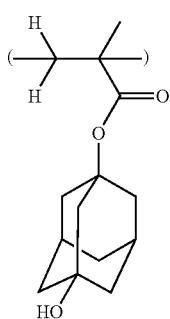
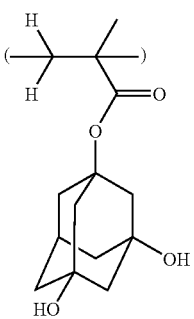

-continued
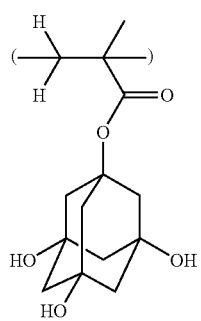 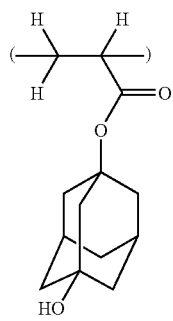 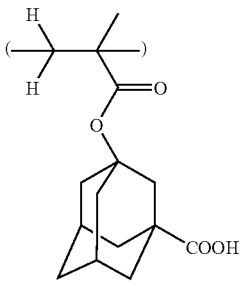 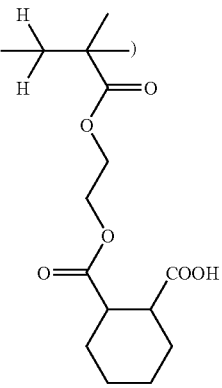
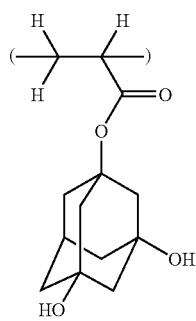 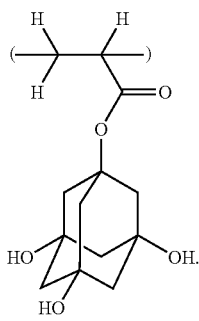
4. The polymer of claim 1, wherein the recurring unit having the general formula (2) is selected from the group consisting of the units represented by the following formulae:
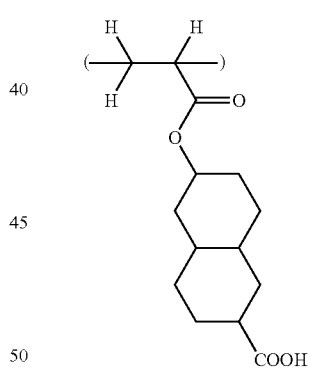 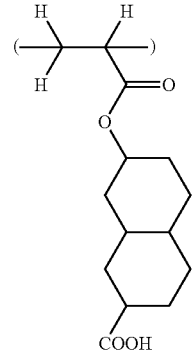
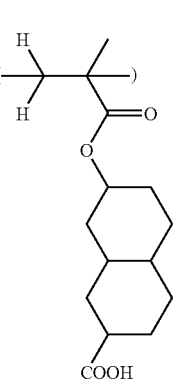 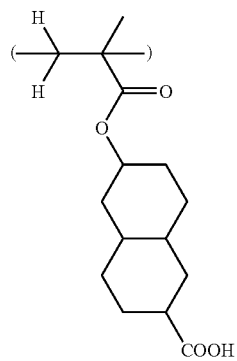 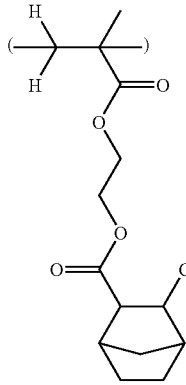 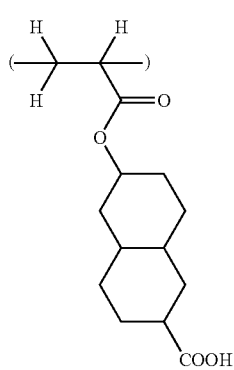 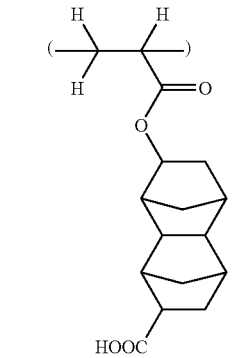
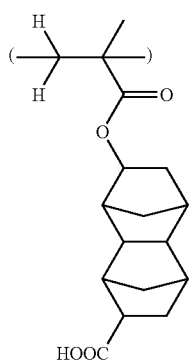 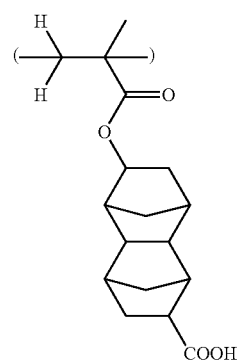 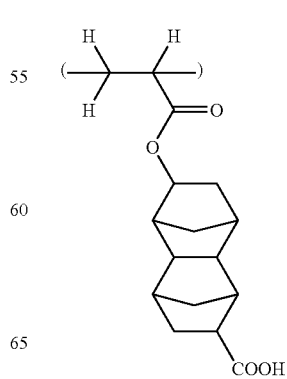 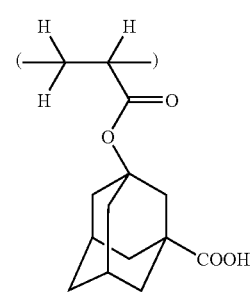

-continued

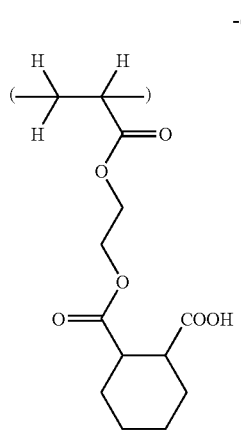 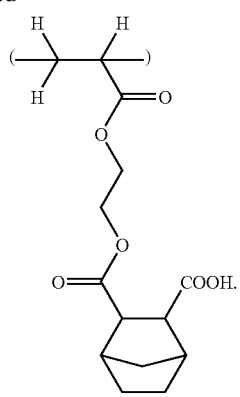

5. A resist composition comprising the polymer of claim 1.

6. A pattern forming process comprising the steps of
applying the resist composition comprising the polymer of claim 1 onto a substrate to form a coating,
heat treating the coating and then exposing it to high-energy radiation having a wavelength of up to 300 nm or electron beam through a photomask, and
heat treating the exposed coating and developing it with a developer.

7. A polymer comprising recurring units having the general formulae (1) and (2), the recurring units being of at least one type for each formula, and having a weight average molecular weight of 1,000 to 50,000,

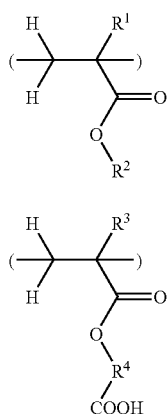

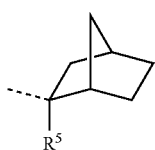

wherein $R^1$ is hydrogen or methyl, $R^2$ is an acid labile group selected from the general formulae ($R^2$-1) to ($R^2$-7):

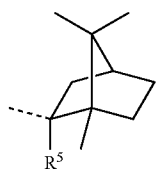

-continued

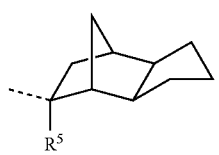

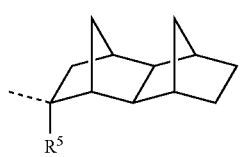

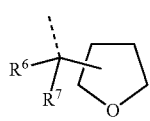

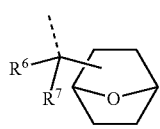

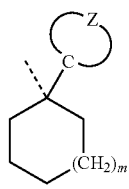

wherein the broken line indicates a bonding site and direction, $R^5$ is each independently a straight, branched or cyclic alkyl group of 1 to 10 carbon atoms, $R^6$ and $R^7$ are each independently a straight, branched or cyclic alkyl group of 1 to 10 carbon atoms, or $R^6$ and $R^7$, taken together, may form a ring with the carbon atom to which they are attached, Z is a divalent hydrocarbon group of 2 to 20 carbon atoms which forms a single ring or bridged ring with the carbon atom to which it is attached and which may contain an oxygen atom, and m is 0 or 1, and the recurring unit having the general formula (2) is selected from the group consisting of the units represented by the following formulae:

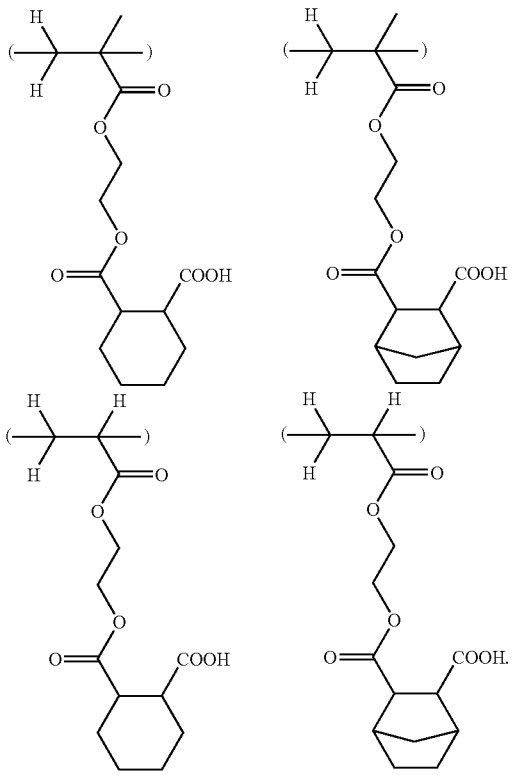

8. The polymer of claim 7, which comprises recurring units having the general formulae (1) to (3), the recurring units being of at least one type for each formula, and having a weight average molecular weight of 1,000 to 50,000,

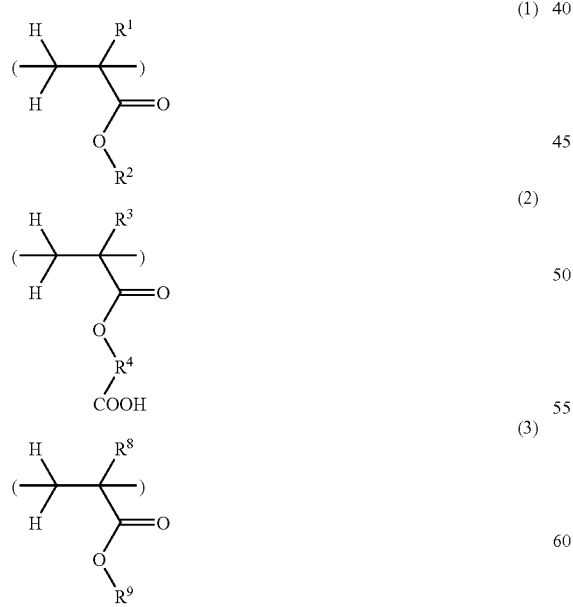

wherein $R^1$ and $R^8$ are independently hydrogen or methyl, $R^2$ is an acid labile group selected from the general formulae ($R^2$-1) to ($R^2$-7):

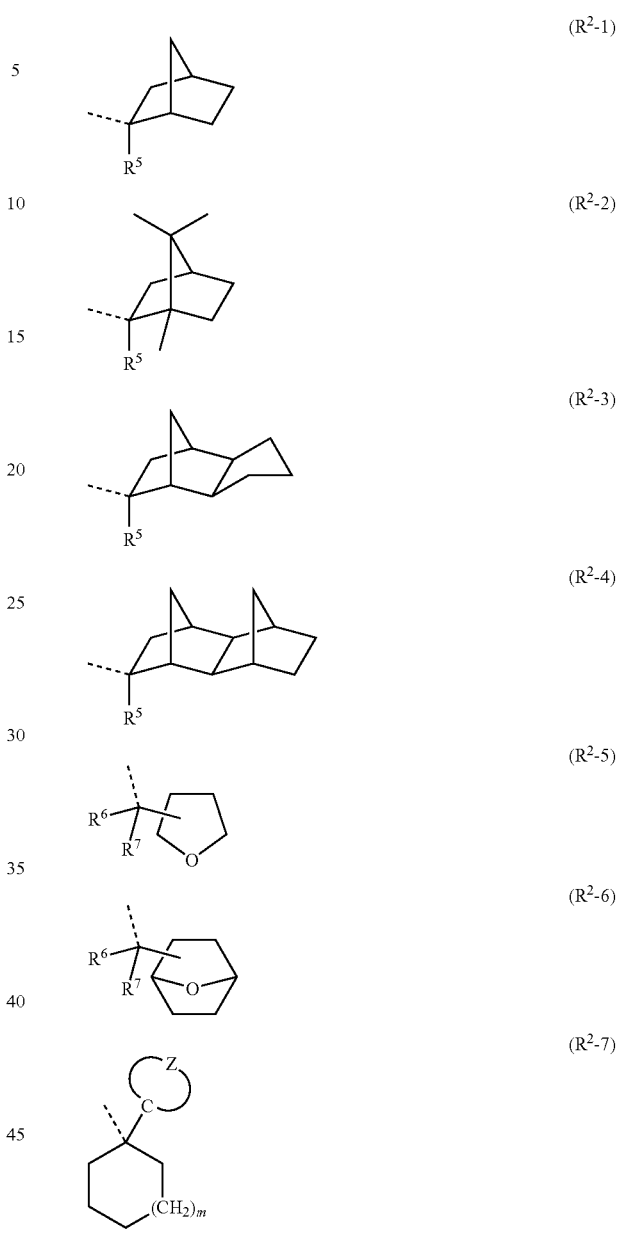

wherein the broken line indicates a bonding site and direction, $R^5$ is each independently a straight, branched or cyclic alkyl group of 1 to 10 carbon atoms, $R^6$ and $R^7$ are each independently a straight, branched or cyclic alkyl group of 1 to 10 carbon atoms, or $R^6$ and $R^7$, taken together, may form a ring with the carbon atom to which they are attached, Z is a divalent hydrocarbon group of 2 to 20 carbon atoms which forms a single ring or bridged ring with the carbon atom to which it is attached and which may contain an oxygen atom, and m is 0 or 1, $R^9$ is a group having a lactone structure, and the recurring unit having the general formula (2) is selected from the group consisting of the units represented by the following formulae:

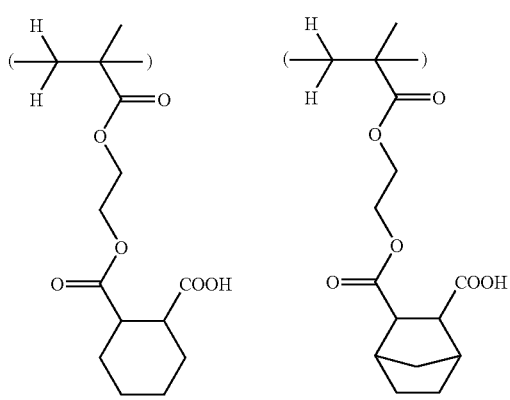

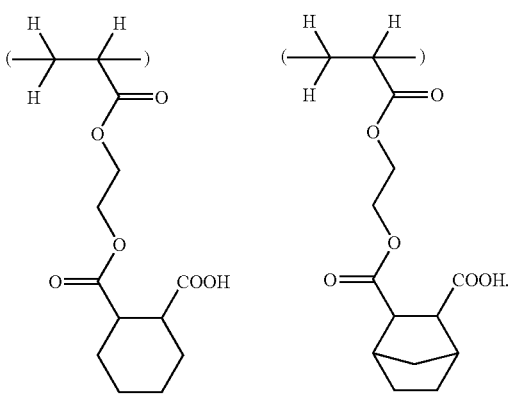

9. The polymer of claim 8, wherein the recurring unit having the general formula (3) is selected from the group consisting of the units represented by the following formulae:

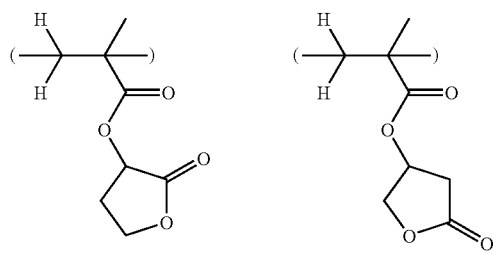

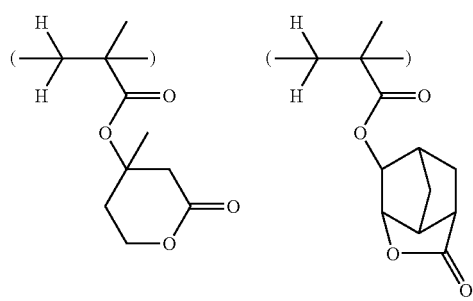

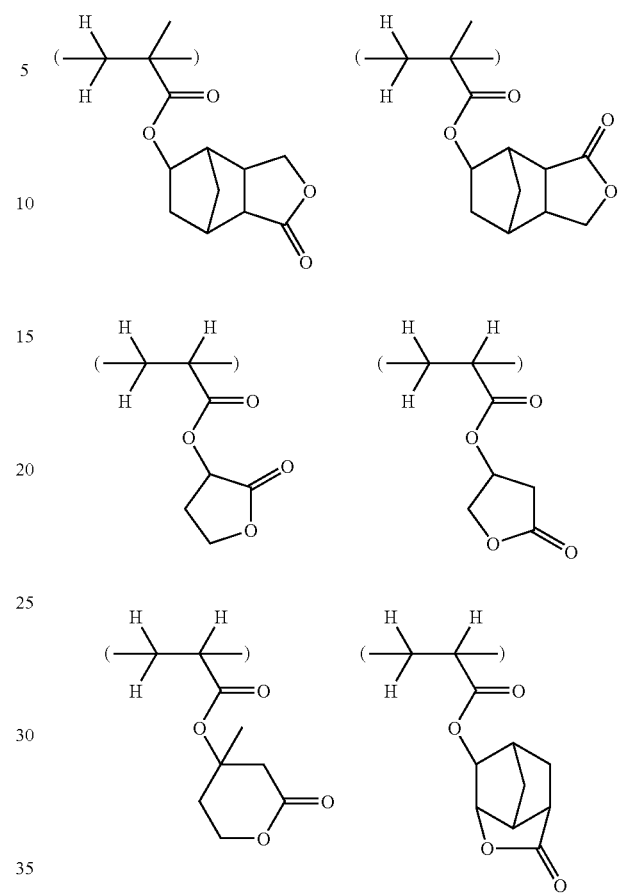

10. A resist composition comprising the polymer of claim 8.

11. The polymer of claim 7, which comprises recurring units having the general formulae (1) to (4), the recurring units being of at least one type for each formula, and having a weight average molecular weight of 1,000 to 50,000,

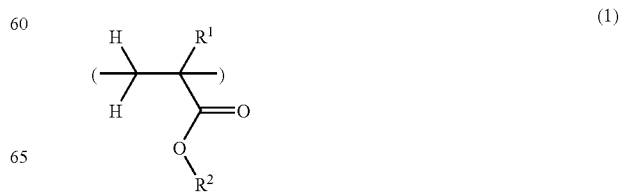

(1)

-continued

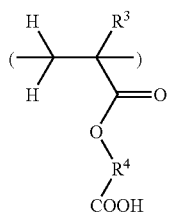
(2)

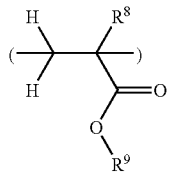
(3)

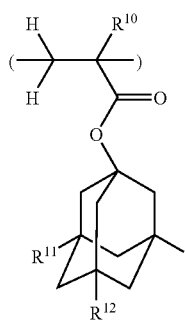
(4)

wherein $R^1$, $R^8$ and $R^{10}$ are independently hydrogen or methyl, $R^2$ is an acid labile group selected from the general formulae ($R^2$-1) to ($R^2$-7):

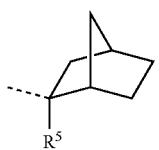
($R^2$-1)

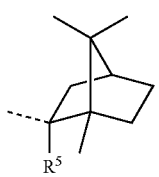
($R^2$-2)

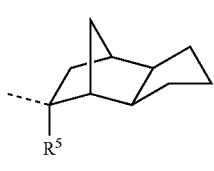
($R^2$-3)

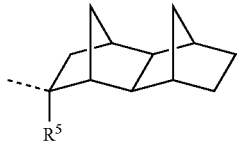
($R^2$-4)

($R^2$-5)

($R^2$-6)

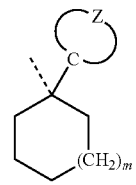
($R^2$-7)

wherein the broken line indicates a bonding site and direction, $R^5$ is each independently a straight, branched or cyclic alkyl group of 1 to 10 carbon atoms, $R^6$ and $R^7$ are each independently a straight, branched or cyclic alkyl group of 1 to 10 carbon atoms, or $R^6$ and $R^7$, taken together, may form a ring with the carbon atom to which they are attached, Z is a divalent hydrocarbon group of 2 to 20 carbon atoms which forms a single ring or bridged ring with the carbon atom to which it is attached and which may contain an oxygen atom, and m is 0 or 1, $R^9$ is a group having a lactone structure, $R^{11}$ and $R^{12}$ are independently hydrogen or hydroxyl, and the recurring unit having the general formula (2) is selected from the group consisting of the units represented by the following formulae:

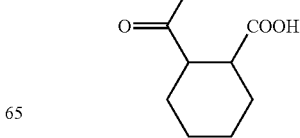
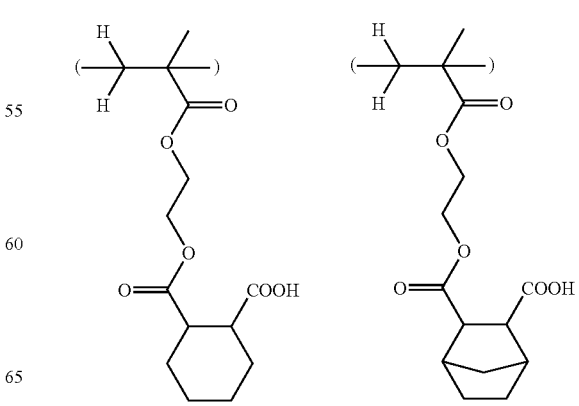

-continued
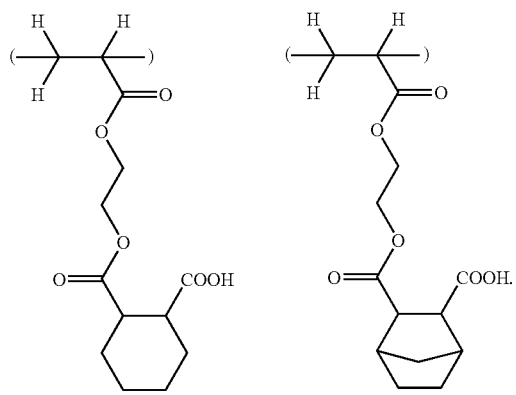
12. The polymer of claim 11, wherein the recurring unit having the general formula (3) is selected from the group consisting of the units represented by the following formulae:
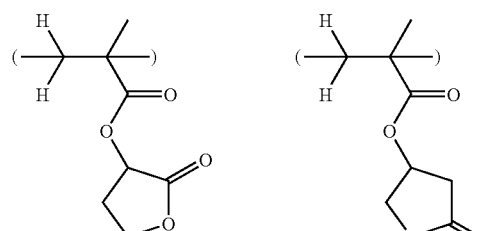
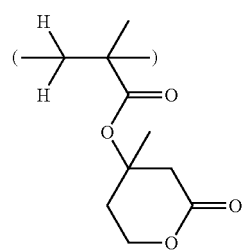
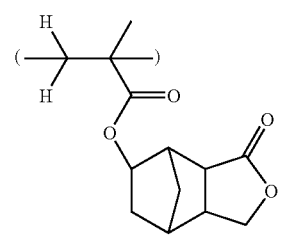
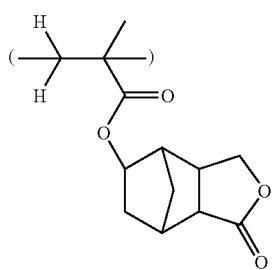
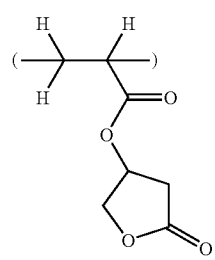
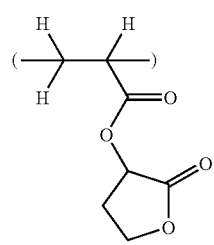
-continued
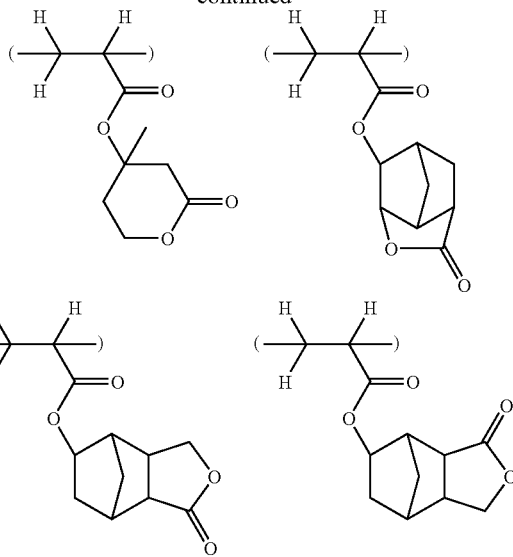
13. The polymer of claim 11, wherein the recurring unit having the general formula (4) is selected from the group consisting of the units represented by the following formulae:
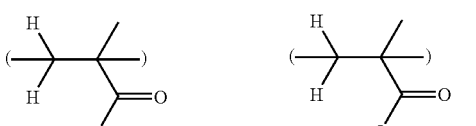
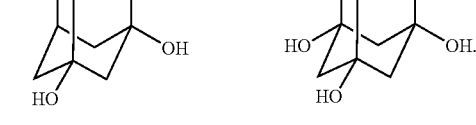

14. A resist composition comprising the polymer of claim 11.

15. The polymer of claim 7, which comprises recurring units having the general formulae (1), (2), (4) and (5), the recurring units being of at least one type for each formula, and having a weight average molecular weight of 1,000 to 50,000,

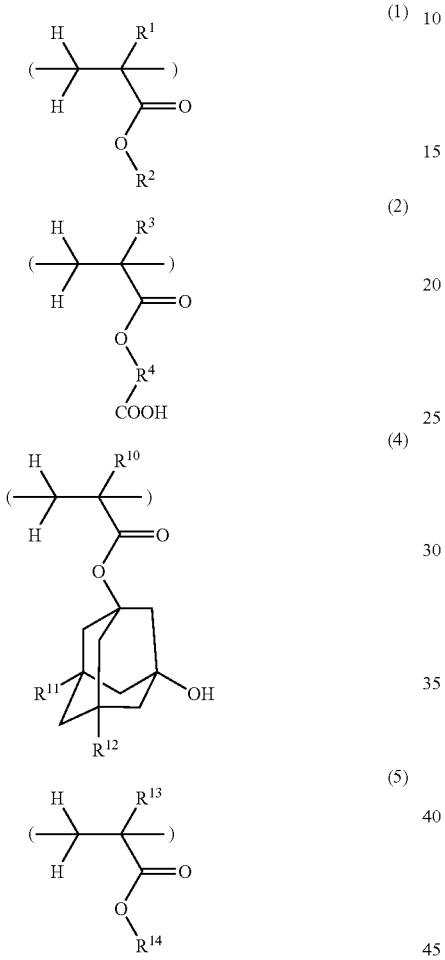

wherein $R^1$, $R^{10}$ and $R^{13}$ are independently hydrogen or methyl, $R^2$ is an acid labile group selected from the general formulae ($R^2$-1) to ($R^2$-7):

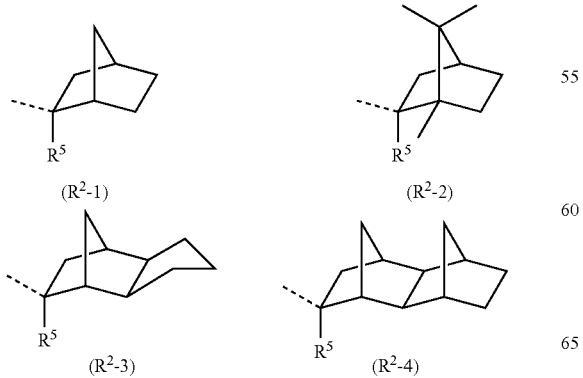

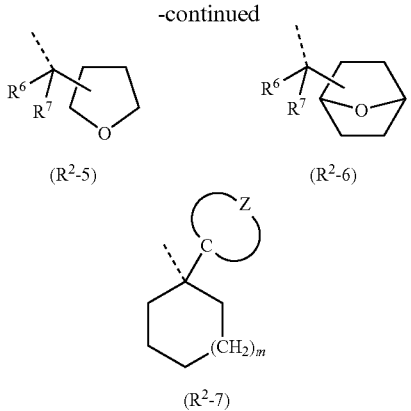

wherein the broken line indicates a bonding site and direction, $R^5$ is each independently a straight, branched or cyclic alkyl group of 1 to 10 carbon atoms, $R^6$ and $R^7$ are each independently a straight, branched or cyclic alkyl group of 1 to 10 carbon atoms, or $R^6$ and $R^7$, taken together, may form a ring with the carbon atom to which they are attached, Z is a divalent hydrocarbon group of 2 to 20 carbon atoms which forms a single ring or bridged ring with the carbon atom to which it is attached and which may contain an oxygen atom, and m is 0 or 1, $R^{11}$ and $R^{12}$ are independently hydrogen or hydroxyl, and $R^{14}$ is a lactone structure-containing group selected from the general formulae ($R^{14}$-1) to ($R^{14}$-5):

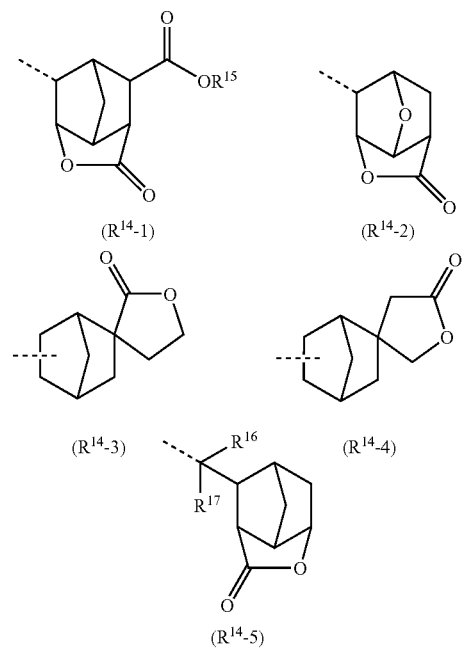

wherein the broken line indicates a bonding site, $R^{15}$ is a straight, branched or cyclic alkyl group of 1 to 10 carbon atoms, $R^{16}$ and $R^{17}$ are each independently hydrogen or a straight, branched or cyclic alkyl group of 1 to 10 carbon atoms, or $R^{16}$ and $R^{17}$, taken together, may form a ring with the carbon atom to which they are attached, and the recurring unit having the general formula (2) is selected from the group consisting of the units represented by the following formulae:

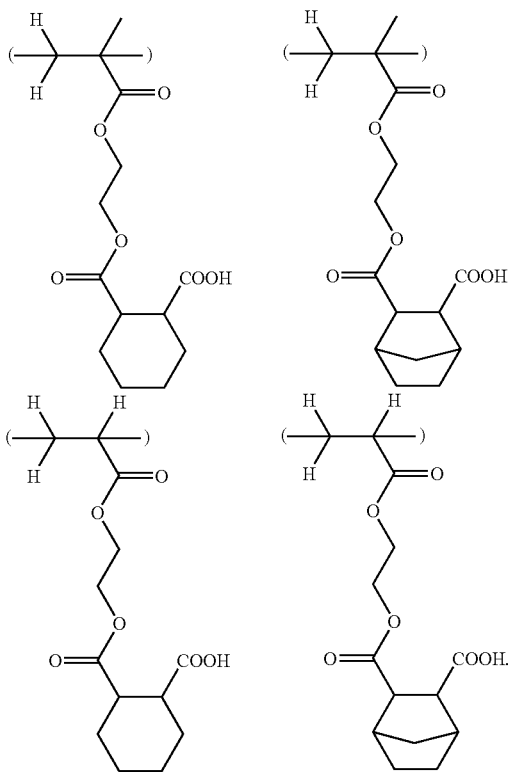

16. The polymer of claim 15, wherein the recurring unit having the general formula (4) is selected from the group consisting of the units represented by the following formulae:

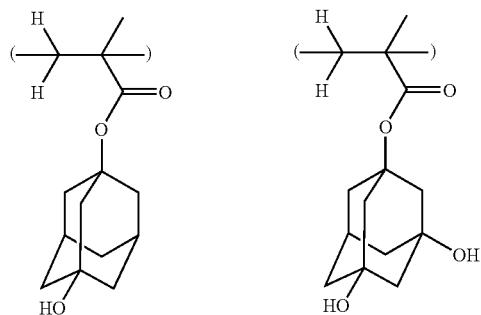

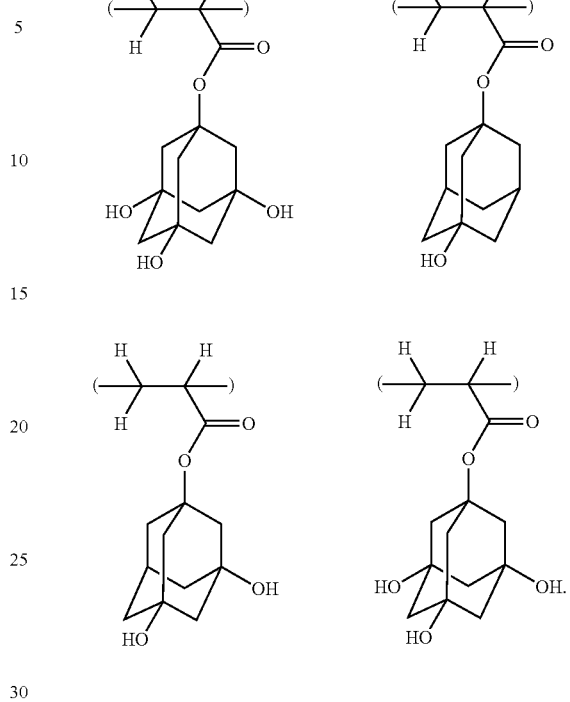

17. A resist composition comprising the polymer of claim 15.

18. A resist composition comprising the polymer of claim 7.

19. A pattern forming process comprising the steps of applying the resist composition of claim 18 onto a substrate to form a coating, heat treating the coating and then exposing it to high-energy radiation having a wavelength of up to 300 nm or electron beam through a photomask, and heat treating the exposed coating and developing it with a developer.

\* \* \* \* \*